United States Patent
Kim

(10) Patent No.: US 9,859,207 B2
(45) Date of Patent: Jan. 2, 2018

(54) INTEGRATED CIRCUIT DEVICE INCLUDING VERTICAL MEMORY DEVICE AND METHOD OF MANUFACTURING THE SAME

(71) Applicant: SAMSUNG ELECTRONICS CO., LTD., Suwon-si, Gyeonggi-do (KR)

(72) Inventor: Kwang-Soo Kim, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/245,441

(22) Filed: Aug. 24, 2016

(65) Prior Publication Data

US 2017/0221813 A1    Aug. 3, 2017

(30) Foreign Application Priority Data

Jan. 28, 2016 (KR) .......................... 10-2016-0010725

(51) Int. Cl.
*H01L 23/522* (2006.01)
*H01L 23/528* (2006.01)
*H01L 27/115* (2017.01)

(52) U.S. Cl.
CPC ........ *H01L 23/5226* (2013.01); *H01L 23/528* (2013.01); *H01L 27/115* (2013.01)

(58) Field of Classification Search
CPC . H01L 29/792; H01L 27/115; H01L 23/5226; H01L 23/528; H01L 23/522
USPC ................................. 257/774, 324, 326, 773
See application file for complete search history.

(56) References Cited

U.S. PATENT DOCUMENTS

| 6,031,779 | A  | * | 2/2000  | Takahashi ................. G11C 7/06 365/189.09 |
| 8,084,805 | B2 |   | 12/2011 | Shim et al. |
| 8,519,462 | B2 | * | 8/2013  | Wang ................ H01L 27/10814 257/298 |
| 8,653,585 | B2 |   | 2/2014  | Youm et al. |
| 8,664,101 | B2 |   | 3/2014  | Kim et al. |
| 8,896,123 | B2 |   | 11/2014 | Jeong et al. |
| 8,912,592 | B2 |   | 12/2014 | Lim et al. |
| 8,921,918 | B2 |   | 12/2014 | Shim et al. |
| 8,942,042 | B2 |   | 1/2015  | Lee et al. |
| 8,952,426 | B2 |   | 2/2015  | Maejima |
| 9,023,702 | B2 |   | 5/2015  | Lee |
| 9,064,736 | B2 |   | 6/2015  | Lee et al. |
| 9,406,670 | B1 | * | 8/2016  | Or-Bach ................ G03F 9/7076 |
| 9,406,692 | B2 | * | 8/2016  | Lee ................... H01L 27/11582 |

(Continued)

FOREIGN PATENT DOCUMENTS

| KR | 1020130080983 | 7/2013 |
| KR | 1020140093106 | 7/2014 |

*Primary Examiner* — Alexander Oscar Williams
(74) *Attorney, Agent, or Firm* — F. Chau & Associates, LLC

(57) ABSTRACT

An integrated circuit (IC) device includes: a channel region that extends on the substrate to penetrate a plurality of word lines; a bit line contact pad that contacts an upper surface of the channel region; a bit line that contacts the bit line contact pad and extends on the bit line contact pad in a direction parallel to the main surface of the substrate; a common source line that partially fills a word line cut region and has a height lower than that of the channel region; and a common source via contact that contacts an upper surface of the common source line in the word line cut region.

15 Claims, 32 Drawing Sheets

(56) References Cited

U.S. PATENT DOCUMENTS

| | | | |
|---|---|---|---|
| 9,419,013 B1* | 8/2016 | Lee | H01L 27/11582 |
| 2007/0285985 A1* | 12/2007 | Kwak | G11C 16/3418 |
| | | | 365/185.17 |
| 2014/0068222 A1 | 3/2014 | Park et al. | |
| 2015/0041901 A1 | 2/2015 | Son et al. | |
| 2015/0115345 A1 | 4/2015 | Nowak et al. | |
| 2015/0179660 A1 | 6/2015 | Yada et al. | |
| 2015/0221351 A1 | 8/2015 | Park et al. | |
| 2015/0221666 A1 | 8/2015 | Lee | |
| 2015/0303214 A1* | 10/2015 | Kim | H01L 27/11582 |
| | | | 257/329 |
| 2016/0163686 A1* | 6/2016 | Lee | H01L 27/11565 |
| | | | 257/314 |
| 2016/0224407 A1* | 8/2016 | Rajendran | G06F 17/5068 |
| 2016/0336340 A1* | 11/2016 | Song | H01L 27/11582 |

* cited by examiner

C-C'

D-D'

C-C'

D-D'

INTEGRATED CIRCUIT DEVICE INCLUDING VERTICAL MEMORY DEVICE AND METHOD OF MANUFACTURING THE SAME

CROSS-REFERENCE TO RELATED APPLICATION

This application claims the benefit under 35 U.S.C. §119 of Korean Patent Application No. 10-2016-0010725, filed on Jan. 28, 2016, in the Korean Intellectual Property Office, the disclosure of which is incorporated by reference herein in its entirety.

TECHNICAL FIELD

The inventive concept relates to an integrated circuit (IC) device and a method of manufacturing the IC device, and more particularly, to an IC device including a nonvolatile vertical memory device and a method of manufacturing the IC device.

DISCUSSION OF RELATED ART

Large capacity and high integration of IC devices including memory devices are features required to meet the demand for multifunctional information and communication devices. The high integration of the memory devices with a reduction in memory cell sizes have made those functions and features included in the memory devices such as operations of memory devices, and structures of operational circuits and interconnection lines, to become more complicated

SUMMARY

According to an aspect of the inventive concept, there is provided an IC device including: a plurality of word lines that extend on a substrate parallel to a main surface of the substrate and are separated from one another in a first direction perpendicular to the main surface; a channel region that extends in a first region on the substrate through the plurality of word lines; a bit line contact pad that is on the channel region and contacts an upper surface of the channel region; a bit line that contacts the bit line contact pad in the first region and extends on the bit line contact pad in a second direction parallel to the main surface of the substrate; a common source line that partially fills a word line cut region, the word line cut region extending in a third direction on a side of the plurality of word lines, the third direction being parallel to the main surface of the substrate and intersecting the second direction, the common source line having a height lower than that of the channel region; and a common source via contact that contacts an upper surface of the common source line in the word line cut region and extends from the upper surface of the common source line in a direction away from the substrate.

According to another aspect of the inventive concept, there is provided an IC device including: a peripheral circuit on a substrate; a semiconductor layer on the peripheral circuit; a memory cell array region on the semiconductor layer and overlapping the peripheral circuit in a vertical direction, the memory cell array region including a plurality of memory cell arrays and a common source line tab region between adjacent two of the plurality of memory cell arrays; a plurality of word lines that extend on the semiconductor layer, parallel to a main surface of the substrate, and are included in each of the plurality of memory cell arrays and separated from one another in a first direction perpendicular to the main surface of the substrate; a plurality of channel regions that extend on the semiconductor layer in the first direction, passing through the plurality of word lines; a plurality of bit line contact pads that are on the plurality of channel regions to contact the plurality of channel regions; a plurality of bit lines that extend in a region separated from the common source line tab region, in a second direction parallel to the main surface of the substrate and contact a plurality of bit line contact pads; a common source line that partially fills a word line cut region, the word line cut region extending in a third direction on a side of the plurality of word lines, the third direction being parallel to the main surface of the substrate and intersecting the second direction, the common source line having a height lower than that of the plurality of channel regions; and at least one common source via contact that contacts an upper surface of the common source line in the common source line tab region and extends from the upper surface of the common source line in a direction away from the substrate.

According to another aspect of the inventive concept, there is provided a method of manufacturing an integrated circuit (IC) device, the method including forming a structure in which a plurality of insulating layers and a plurality of preliminary gate layers are alternately stacked one by one on a substrate. A plurality of channel holes penetrating the structure may be formed. A plurality of channel regions may be formed in a plurality of first channel holes selected from the plurality of channel holes in a first region on the substrate, and a plurality of dummy channel regions may be formed in a plurality of second channel holes selected from the plurality of channel holes in a second region separated from the first region on the substrate, followed by forming a word line cut region that exposes the plurality of preliminary gate layers and penetrates the structure to extend in a linear shape in a direction parallel to the main surface of the substrate to pass the first region and the second region. The plurality of preliminary gate layers exposed through the word line cut region may be substituted with a plurality of conductive layers. An insulating spacer that covers an inner sidewall of the word line cut region may be formed, followed by forming a common source line that fills only a lower portion of the word line cut region, leaving a recess space in an upper portion of the word line cut region. A word line cut region buried insulating layer may be formed in the recess space to cover the common source line in the recess space. A via contact hole that penetrates the word line cut region buried insulating layer may be formed in the second region. A common source via contact may be formed in the via contact hole to contact the common source line.

According to still another aspect of the inventive concept, there is provided an IC device including: at least one ground select line, a plurality of word lines, and at least one string select line sequentially stacked on a substrate, extending parallel to a main surface of the substrate and being spaced apart from one another with an insulating layer interposed between each separation in a first direction perpendicular to the main surface; a channel region extending in a first region on the substrate through the at least one ground select line, the plurality of word lines, and the at least one string select line; a dummy channel region extending in a second region separated from the first region on the substrate through the at least one ground select line, the plurality of word lines, and the at least one string select line; a bit line contact pad deposited on the channel region and contacting an upper surface of the channel region; a bit line contacting the bit line contact pad in the first region and extending on the bit line contact pad in a second direction parallel to the main surface of the substrate; a common source line partially filling a word line cut region, the word line cut region extending in a third direction on a side of the at least one ground select line, the plurality of word lines, and the at least one string select line, the third direction being parallel to the main surface of the substrate and intersecting the second direction; a word line cut region buried insulating layer deposited on the common source line in the word line cut region to fill up the word line cut region; a common source via contact surrounded by the word line cut region buried insulating layer, contacting an upper surface of the common source line in the word line cut region and extending from the upper surface of the common source line in a direction away from the substrate in the second region; a first upper wiring layer covering the bit line in the first region with an upper insulating layer interposed therebetween; and a second upper wiring layer formed at a level the same as that of the first upper wiring layer in the second region and being connected to the common source via contact.

BRIEF DESCRIPTION OF THE DRAWINGS

Embodiments of the inventive concept will be more clearly understood from the following detailed description taken in conjunction with the accompanying drawings in which:

FIG. 1A is a plan view of main elements of the IC device according to an exemplary embodiment of the inventive concept, FIG. 1B is a schematic perspective view of main elements in a region denoted by "1B" in FIG. 1A, FIG. 1C is a schematic vertical cross-sectional view taken along line C-C' in FIG. 1A, and FIG. 1D is a schematic vertical cross-sectional view taken along line D-D' in FIG. 1A;

FIG. 5A is a schematic cross-sectional view of a structure of a region of the IC device corresponding to the region taken along line C-C' in FIG. 1A, and FIG. 5B is a schematic cross-sectional view of a structure of a region of the IC device corresponding to the region taken along line D-D' in FIG. 1A;

FIG. 6A is a schematic cross-sectional view of a structure of a region of the IC device corresponding to the region taken along line C-C' in FIG. 1A, and FIG. 6B is a schematic cross-sectional view of a structure of a region of the IC device corresponding to the region taken along line D-D' in FIG. 1A;

FIG. 8A is a schematic perspective view of main elements in a region of the IC device corresponding to the region "1B" of FIG. 1A, FIG. 8B is a schematic cross-sectional view of a portion of the IC device corresponding to the region taken along C-C' in FIG. 1A, and FIG. 8C is a schematic cross-sectional view of a portion of the IC device corresponding to the region taken along D-D' in FIG. 1A;

Figure 1A:
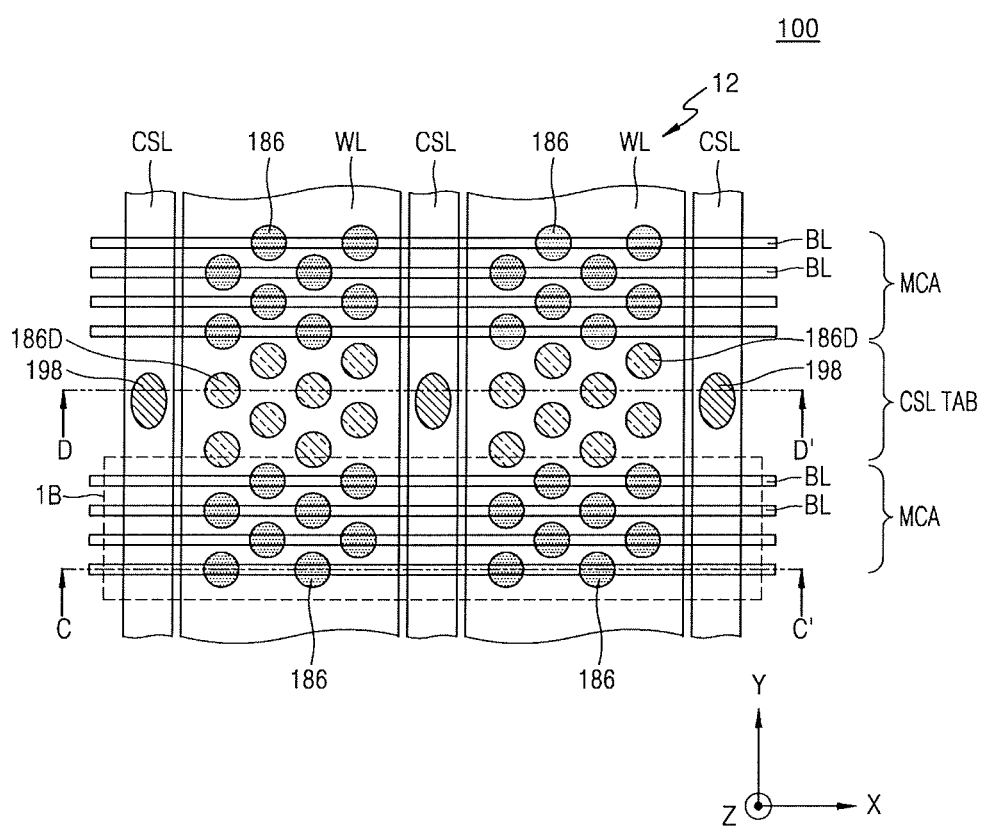
FIGS. 1A to 1D are views illustrating an integrated circuit (IC) device according to an exemplary embodiment of the inventive concept, and in particular.

Since the drawings in FIGS. 1-12 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, exemplary embodiments of the inventive concept will be described in detail with reference to the accompanying drawings. Like reference numerals in the drawings denote like elements, and thus their redundant description will be omitted.

It will be understood that, although the terms "first", "second", "third", "fourth" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, or vice versa, without departing from the teachings of the present inventive concept.

Figure 1B:
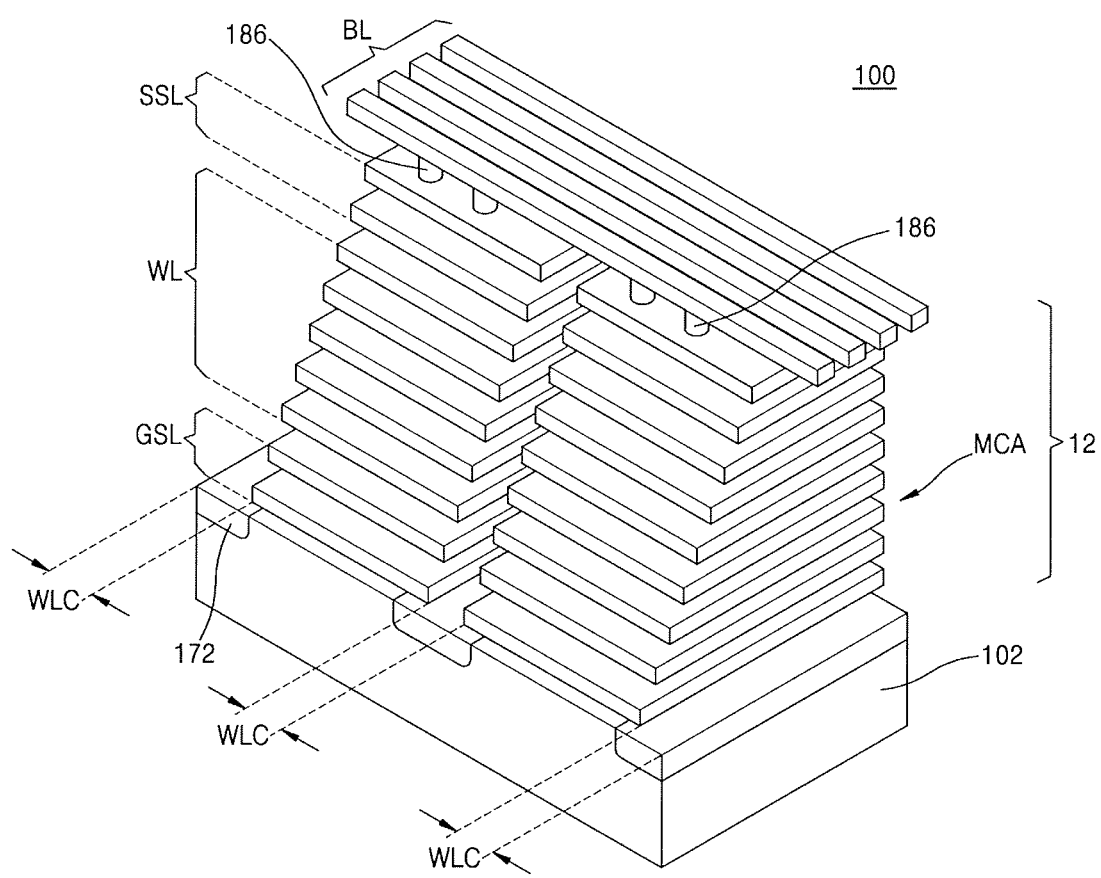
Figure 1C:
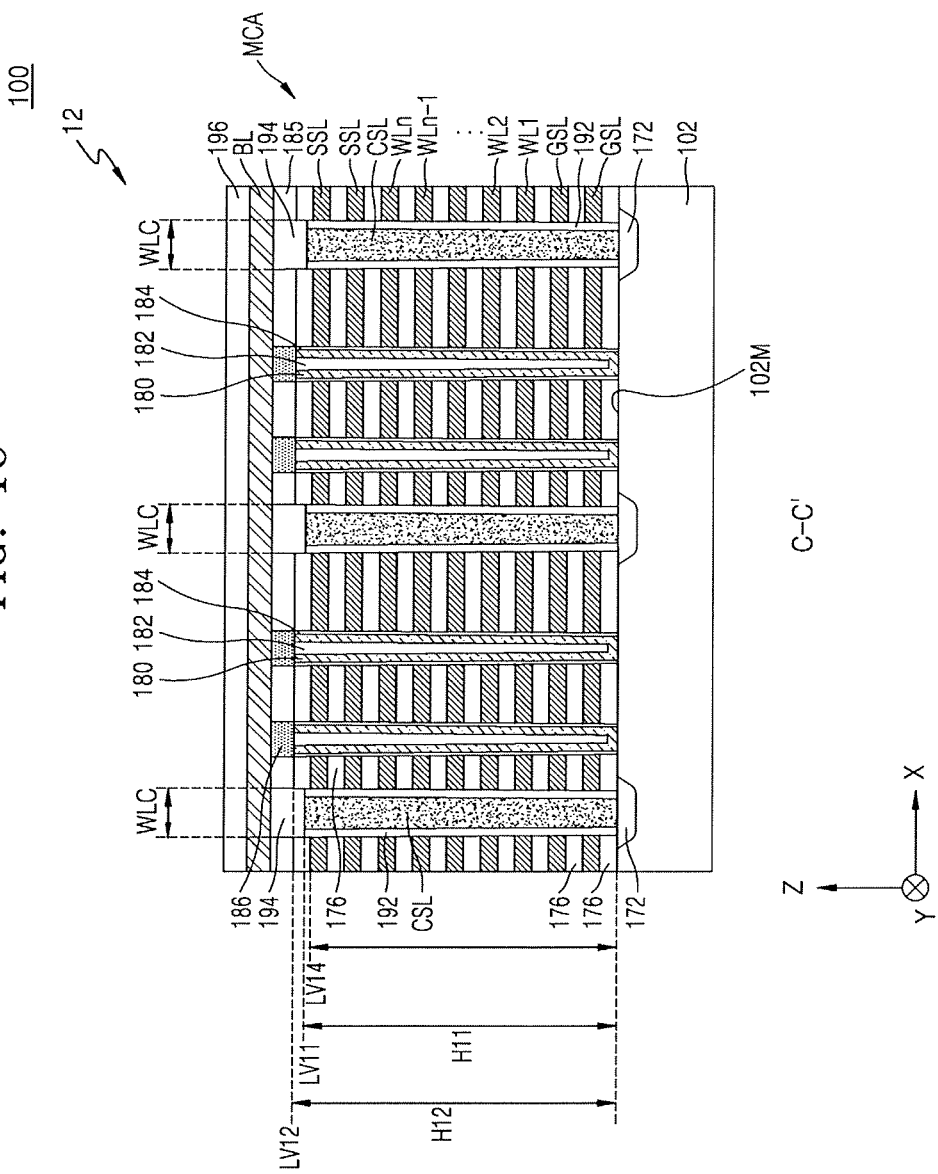
Figure 1D:
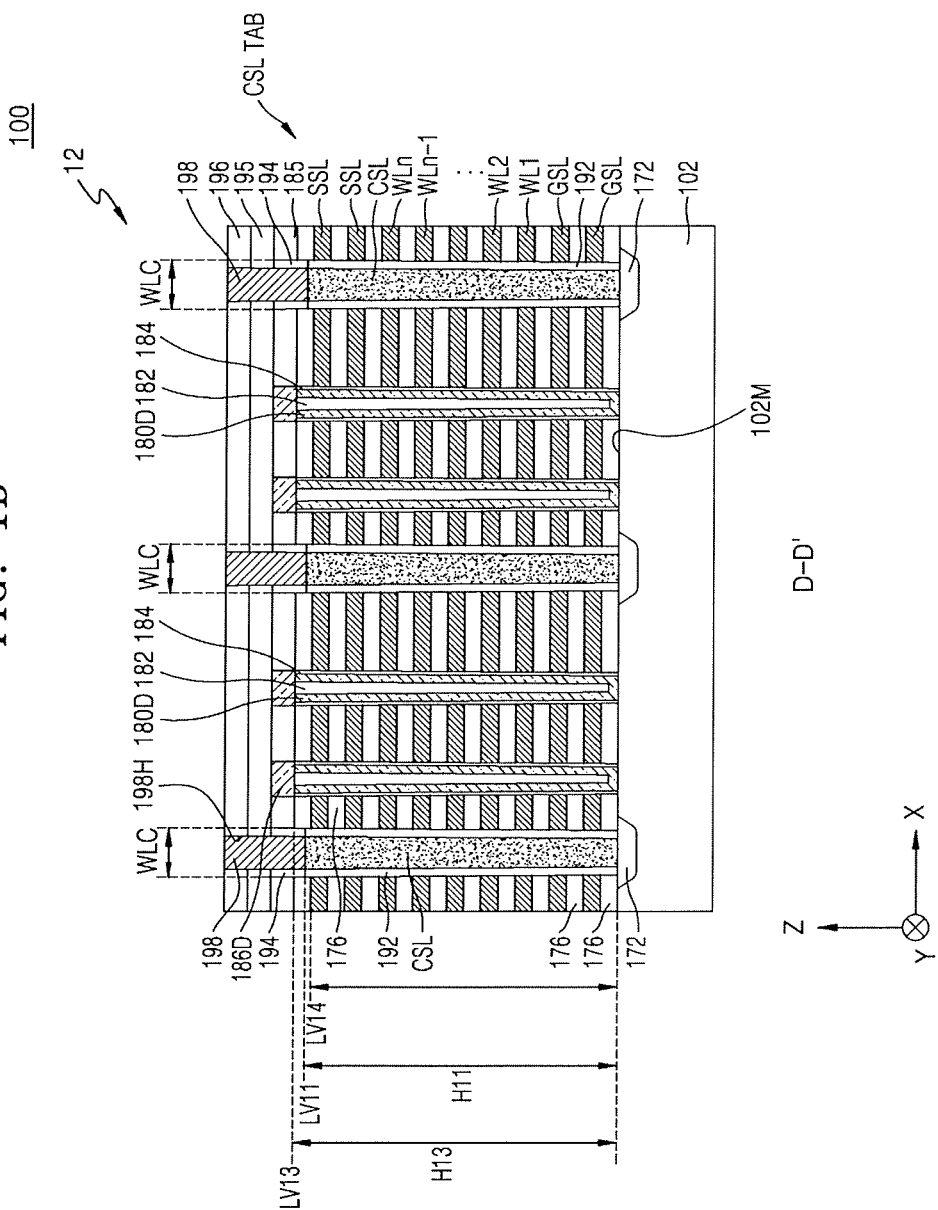

FIGS. 1A to 1D are views illustrating an integrated circuit (IC) device 100 according to an exemplary embodiment of the inventive concept. In particular, FIG. 1A is a plan view of main elements of the IC device 100 according to an exemplary embodiment of the inventive concept. FIG. 1B is a schematic perspective view of main elements in a region denoted by "1B" in FIG. 1A. FIG. 1C is a schematic vertical cross-sectional view taken along line C-C' in FIG. 1A. FIG. 1D is a schematic vertical cross-sectional view taken along line D-D' in FIG. 1A.

Referring to FIGS. 1A to 1D, the IC device 100 includes a memory cell array region 12 on a substrate 102.

The substrate 102 may have a main surface 102M extending in the X direction and the Y direction. The substrate 102 may include a semiconductor substrate or a semiconductor-on-insulator substrate. The substrate 102 may include, for example, Si, Ge, or SiGe. In an exemplary embodiment of the inventive concept, the substrate 102 may include, for example, a silicon-on-insulator (SOI) substrate or a germanium-on-insulator (GeOI) substrate.

As illustrated in FIG. 1A, the memory cell array region 12 of the IC device 100 may include a plurality of memory cell arrays MCAs. A common source line tab region CSL TAB included in the memory cell array region 12 may be between adjacent two of the plurality of memory cell arrays MCAs.

Figure 2:
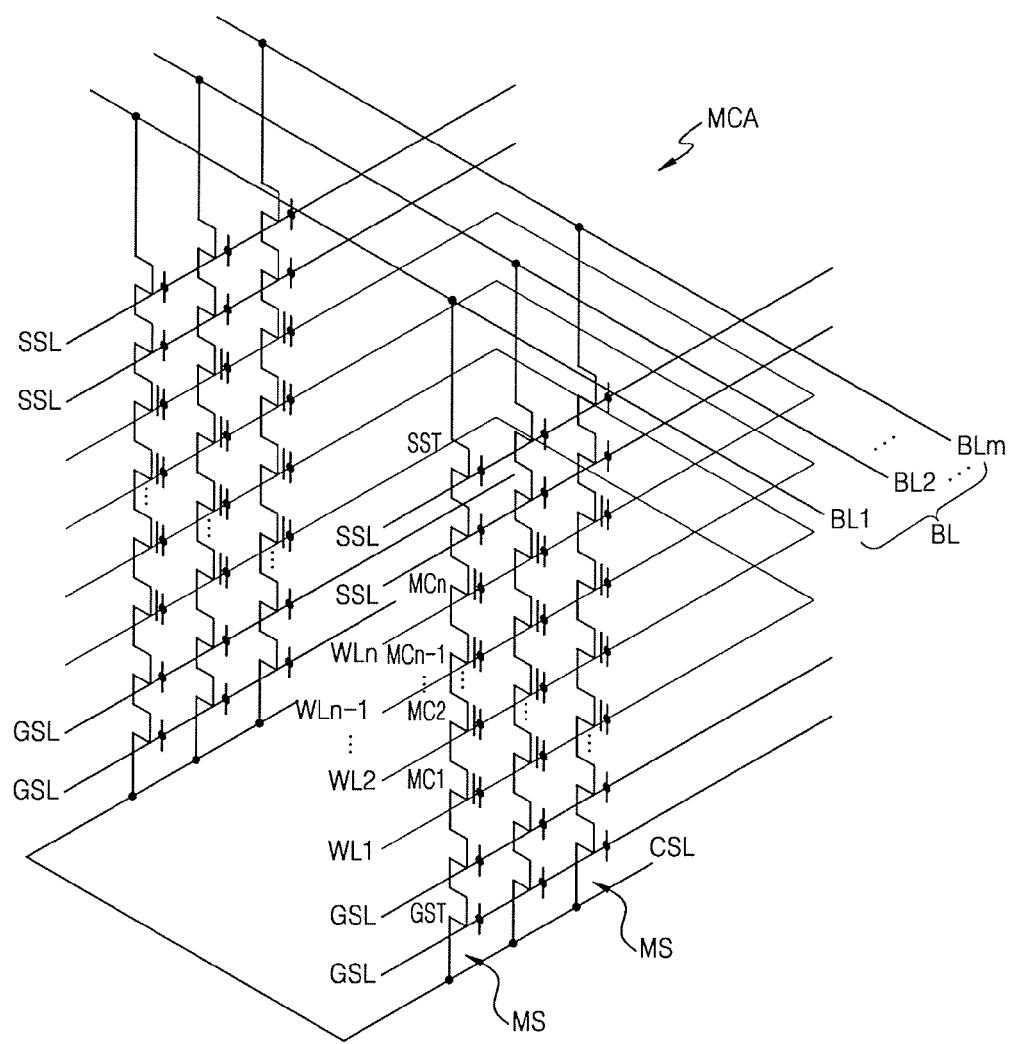
FIG. 2 is an equivalent circuit diagram of a memory cell array (MCA) in a memory cell array region of an IC device according to an exemplary embodiment of the inventive concept.

FIG. 2 is an equivalent circuit diagram of a memory cell array MCA in the memory cell array region 12 of the IC device 100, and in particular, illustrates an equivalent circuit diagram of a NAND flash memory device having a vertical channel structure. The NAND flash memory device illustrated is a non-planar and nonvolatile memory device.

Referring to FIG. 2, the memory cell array MCA may include a plurality of memory cell strings MS. The memory cell array MCA may include a plurality of bit lines BL1, BL2, . . . , BLm (collectively denoted by "BL"), a plurality of word lines WL1, WL2, . . . , WLn-1, WLn (collectively denoted by "WL"), at least one string select line SSL, at least one ground select line GSL, and a common source line CSL. The plurality of memory cell strings MS may be between the plurality of bit lines BL1, BL2, . . . , BLm and the common source line CSL.

Each of the plurality of memory cell strings MS may include at least one string select transistor SST, at least one ground select transistor GST, and a plurality of memory cell transistors MC1, MC2, . . . , MCn-1, and MCn. A drain region of the at least one string select transistor SST of each of the plurality of memory cell strings MS may be connected to each of the bit lines BL1, BL2, . . . , BLm, and a source region of the at least one ground select transistor GST of each of the plurality of memory cell strings MS may be connected to the common source line CSL. The common source line CSL may be a region connected in common with source regions of the plurality of ground select transistors GST. Each of the plurality of memory cell strings MS may be connected to each bit line of the bit lines BL1, BL2, . . . , BLm, respectively. However, for some instances, two or more memory cell strings may be connected to the same bit line of the bit lines BL1, BL2, . . . , BLm.

The at least one string select transistor SST may be connected to the at least one string select line SSL, and the at least one ground select transistor GST may be connected to the at least one ground select line GSL. The plurality of memory cell transistors MC1, MC2, . . . , MCn-1, MCn may be connected to the word lines WL1, WL2, . . . , WLn-1, WLn, respectively.

The memory cell array MCA may have a 3-dimensional structure. A plurality of memory cell transistors MC1, MC2, . . . , MCn-1, MCn that constitute the memory cell strings MS may have a structure serially connected to the main surface 102M (refer to FIGS. 1C and 1D) of the substrate 102 in a vertical direction (the Z direction in FIGS. 1A to 1D). Accordingly, channel regions 180 (see FIGS. 1C and 1D) of the at least one string select transistor SST, the at least one ground select transistor GST, and the plurality of memory cell transistors MC1, MC2, . . . , MCn-1, MCn may extend in a substantially vertical direction to the main surface 102M of the substrate 102.

Referring back to FIGS. 1A to 1D, in the memory cell array region 12, the plurality of word lines WL1, WL2, . . . , WLn-1, WLn may extend parallel to an extending direction of the main surface 102M of the substrate 102 and vertically overlap one another and may be separated from one another in a vertical direction of the substrate 102. The plurality of word lines WL1, WL2, . . . , WLn-1, WLn may be repeatedly disposed while being separated from each other at regular intervals by a plurality of word line cut regions WLC in a first direction (the X direction in FIGS. 1A to 1D) that is parallel to an extending direction of the main surface 102M of the substrate 102. The plurality of word line cut regions WLC may extend parallel to one another in a second direction (the Y direction in FIGS. 1A to 1C), which is parallel to the extending direction of the main surface 102M of the substrate 102 and is perpendicular to the first direction, while defining the width of the plurality of word lines WL1, WL2, . . . , WLn-1, WLn in the first direction (the X direction in FIGS. 1A to 1C) that is parallel to the extending direction of the main surface 102M of the substrate 102.

A plurality of common source regions 172 may extend in an extending direction (the Y direction in FIGS. 1A to 1C) of the word line cut regions WLC of the memory cell array MCA parallel to the main surface of the substrate 102 and in upper portions of the substrate 102. In an exemplary embodiment of the inventive concept, the plurality of common source regions 172 may be impurity regions highly doped with, for example, n-type impurities. The n-type impurities may include, for example, phosphorus, arsenic, antimony, or bismuth. The plurality of common source regions 172 may have a conductive type that is different from that of the substrate 102. The plurality of common source regions 172 may serve as a source region that supplies current to vertical memory cells.

The plurality of common source lines CSL may extend in the extending direction (the Y direction in FIGS. 1A to 1C) of the word line cut regions WLC on the common source regions 172. The plurality of common source lines CSL may partially fill the word line cut regions WLC on sidewalls of a pair of ground select lines GSL, the word lines WL1, WL2, . . . , WLn-1, WLn, and a pair of string select lines SSL. The plurality of common source lines CSL may have a height lower than that of the plurality of channel regions 180. The plurality of common source lines CSL may have a sidewall facing the pair of string select lines SSL.

At least one ground select line GSL, a plurality of word lines WL1, WL2, . . . , WLn-1, WLn, and at least one string select line SSL may be sequentially stacked between two adjacent word line cut regions WLC.

The at least one ground select line GSL, the plurality of word lines WL1, WL2, . . . , WLn-1, WLn, and the at least one string select line SSL may each include, for example, metal, metal silicide, semiconductor doped with impurities, or a combination thereof. For example, the at least one ground select line GSL, the plurality of word lines WL1, WL2, . . . , WLn-1, WLn, and the at least one string select line SSL may each include metal, such as tungsten, nickel, cobalt, titanium, or tantalum; metal silicide, such as tungsten silicide, nickel silicide, cobalt silicide, titanium silicide, or tantalum silicide; polysilicon doped with impurities; or a combination thereof. However, the inventive concept is not limited thereto.

Insulating layers 176 may be between the substrate 102 and the at least one ground select line GSL, and between each neighboring two of the at least one ground select line GSL, the plurality of word lines WL1, WL2, . . . , WLn-1, WLn, and the at least one string select line SSL. The insulating layers 176 may be formed of, for example, silicon oxide, silicon nitride, or silicon oxynitride. However, the inventive concept is not limited thereto.

In the memory cell array MCA, the plurality of channel regions 180 (refer to FIG. 1C) may pass through the at least one ground select line GSL, the plurality of word lines WL1, WL2, . . . , WLn−1, WLn, the at least one string select line SSL, and the plurality of insulating layers 176 by extending in a direction (the Z direction) that is perpendicular to the main surface 102M of the substrate 102. The plurality of channel regions 180 may be separated from one another at regular intervals in the X direction and the Y direction. The interval between two immediately neighboring channel regions 180 in the X direction may be the same as or different from the interval between two immediately neighboring channel regions 180 in the Y direction. The arrangement of the plurality of channel regions 180 as illustrated in FIGS. 1A and 1C is only an example, and may be modified or changed in various ways. The plurality of channel regions 180 may be connected to the plurality of bit lines BL, respectively.

A plurality of dummy channel regions 180D (refer to FIG. 1D) that are not connected to a bit line BL may be formed in the common source line tab region CSL TAB. The plurality of dummy channel regions 180D may be formed at the same time with the plurality of channel regions 180 formed in the memory cell array MCA. The plurality of dummy channel regions 180D and the plurality of channel regions 180 may have substantially the same structure.

The plurality of channel regions 180 and the plurality of dummy channel regions 180D may be repeatedly formed at a constant pitch. The first constant pitch between the neighboring ones of the plurality of channel regions 180 and the neighboring ones of the plurality of dummy channel regions 180D in the X direction may be the same as or different from the second constant pitch between the neighboring ones of the plurality of channel regions 180 and the neighboring ones of the plurality of dummy channel regions 180D in the Y direction. In an exemplary embodiment of the inventive concept, the plurality of channel regions 180 and the plurality of dummy channel regions 180D may be arranged to form a hexagonal array.

In an exemplary embodiment of the inventive concept, the plurality of channel regions 180 and the plurality of dummy channel regions 180D may include doped polysilicon and/or undoped polysilicon. The doped polysilicon may have n-type conductivity or p-type conductivity. In an exemplary embodiment of the inventive concept, the plurality of channel regions 180 and the plurality of dummy channel regions 180D may include, for example, metal, conductive metal nitride, silicide, carbon nanotube, graphene, or a combination thereof.

The plurality of channel regions 180 and the plurality of dummy channel regions 180D may each have a cylindrical shape. In an exemplary embodiment of the inventive concept, a buried insulating layer 182 may fill an internal space of each of the plurality of channel regions 180 and the plurality of dummy channel regions 180D. Unlike the exemplary embodiments of FIGS. 1C and 1D, the plurality of channel regions 180 and the plurality of dummy channel regions 180D may have a pillar structure. In this case, the buried insulating layer 182 may not be formed.

A gate dielectric layer 184 may be between the plurality of channel regions 180 and the at least one ground select line GSL, the plurality of word lines WL1, WL2, . . . , WLn−1, WLn, and the at least one string select line SSL, and between the plurality of dummy channel regions 180D and the at least one ground select line GSL, the plurality of word lines WL1, WL2, . . . , WLn−1, WLn, and the at least one string select line SSL.

The gate dielectric layer 184 may include a tunnel insulating layer, a charge storage layer, and a blocking insulating layer, sequentially formed on the sidewall of each of the channel regions 180. The tunnel insulating layer may include, for example, silicon oxide, hafnium oxide, aluminum oxide, zirconium oxide, tantalum oxide, or the like. The charge storage layer is a region in which electrons tunneling through the tunnel insulating layer from the plurality of channel regions 180 may be stored. The charge storage layer may include, for example, silicon nitride, boron nitride, silicon boron nitride, or impurity-doped polysilicon, or may include, for example, a quantum dot, a thin hafnium oxide on silicon oxide layer, graphene, or nano crystal. The blocking insulating layer may include, for example, silicon oxide, silicon nitride, hafnium oxide, aluminum oxide, zirconium oxide, tantalum oxide, yttrium oxide, or a combination thereof. The blocking insulating layer may include a high-k dielectric material having a dielectric constant higher than that of silicon oxide. In particular, the high-k dielectric material may have a dielectric constant greater than the dielectric constant of silicon nitride (e.g., k>7). In an exemplary embodiment of the inventive concept, the tunnel insulating layer, the charge storage layer, and the blocking insulating layer may be formed by, for example, an atomic layer deposition (ALD) process, a chemical vapor deposition (CVD) process, etc.

FIGS. 1C and 1D illustrate an exemplary embodiment of the inventive concept, in which the gate dielectric layers 184 may have a shape extending along the channel regions 180. The gate dielectric layer 184 may surround an outer sidewall of the channel regions 180, and may extend along the sidewall of the channel regions 180 to contact the upper surface of the substrate. However, the inventive concept is not limited thereto.

Figure 3A:
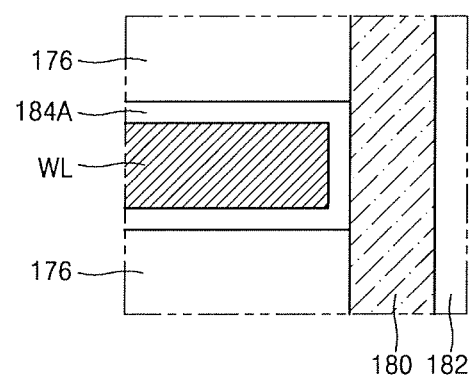
FIGS. 3A and 3B are cross-sectional views illustrating modification examples of gate dielectric layers that are applicable to the IC device according to an exemplary embodiment of the inventive concept.
Figure 3B:
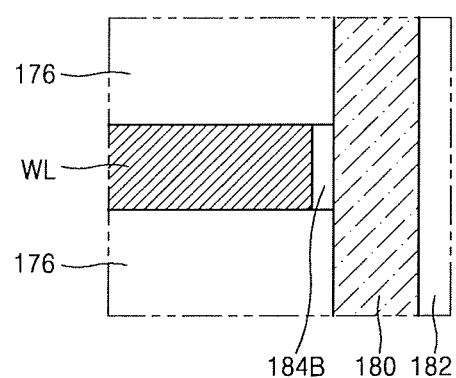

FIGS. 3A and 3B are cross-sectional views illustrating structures of gate dielectric layers 184A and 184B, instead of the gate dielectric layer 184 of FIGS. 1C and 1D, applied to the IC device 100 according to an exemplary embodiment of the inventive concept.

In an exemplary embodiment of the inventive concept, the IC device 100 according to the exemplary embodiment illustrated in FIGS. 1A to 1D may include the gate dielectric layer 184A illustrated in FIG. 3A, instead of the gate dielectric layer 184. The gate dielectric layer 184A may have a surface in contact with the channel region 180 and surfaces in contact with the insulating layers 176, and may cover lower and supper surfaces and a sidewall of the word line WL. The gate dielectric layer 184A may include a blocking insulating layer, a charge storage layer, and a tunnel insulating layer that are sequentially formed on the word line WL.

In an exemplary embodiment of the inventive concept, the IC device 100 according to the exemplary embodiment illustrated in FIGS. 1A to 1D may include the gate dielectric layer 184B illustrated in FIG. 3B, instead of the gate dielectric layer 184. The gate dielectric layer 184E may be formed between the word line WL and the channel region 180, but not between the word line WL and the insulating layers 176. The gate dielectric layer 184B may include a blocking insulating layer, a charge storage layer, and a tunnel insulating layer that are sequentially formed in this stated order on the word line WL. The gate dielectric layer 184B may cover only a sidewall of the word line WL, not the lower and upper surfaces of the word line WL.

Detailed structures of the blocking insulating layer, the charge storage layer, and the tunnel insulating layer of each of the gate dielectric layers 184A and 184B of FIGS. 3A and 3B, respectively, may be the same as those of the blocking insulating layer, the charge storage layer, and the tunnel insulating layer of the gate dielectric layer 184 described above with reference to FIGS. 1A to 1D.

Structures and shapes of gate dielectric layers applicable to IC devices according to the inventive concept are not limited only to the gate dielectric layers 184, 184A, and 184B illustrated in FIGS. 1C, 1D, 3A, and 3B and may be modified or changed in various ways within the scope of the inventive concept.

In an exemplary embodiment of the inventive concept, the gate dielectric layers 184, 184A, and 184B may include a material of which electrical resistance may be changed by heat generated due to the current passing through an adjacent electrode, for example, a phase change material. The phase change material may include at least one of germanium (Ge), Gallium (Ga), antimony (Sb), tellurium (Te), and selenium (Se). The phase change material may further include at least one impurity selected from N, O, C, Bi, In, B, Sn, Si, Ti, Al, Ni, Fe, Dy, and La. The gate dielectric layers 184, 184A, and 184B may include, for example, GeBiTe, InSb, GeSb, GeSbTe, InSbTe, GaSb, GeSbTeN, GeSnSbTe, GeBiSbTe, or GeSnSbTe. GeSbTe (germanium-antimony-tellurium or GST) is a phase-change material from the group of chalcogenide glasses, which may have a composition represented by a formula such as, for example, $Ge_1Sb_4Te_7$, $Ge_2Sb_2Te_5$ or $Ge_1Sb_2Te_4$.

In an exemplary embodiment of the inventive concept, the gate dielectric layers 184, 184A, and 184B may include a thin film structure of which electrical resistance may be changed using spin transfer by electric current. For example, the gate dielectric layers 184, 184A, and 184B may include a ferromagnetic material or an antiferromagnetic material.

In an exemplary embodiment of the inventive concept, the gate dielectric layers 184, 184A, and 184B may include a perovskite compound or a transition metal oxide. For example, the gate dielectric layers 184, 184A, and 184B may include niobium oxide, titanium oxide, nickel oxide, zirconium oxide, vanadium oxide, PCMO ($(Pr,Ca)MnO_3$), strontium-titanium oxide, barium-strontium-titanium oxide, strontium-zirconium oxide, barium-zirconium oxide, or barium-strontium-zirconium oxide.

In an exemplary embodiment of the inventive concept, a barrier metal layer may be further formed between the gate dielectric layer 184 and any one of the at least one ground select line GSL, the plurality of word lines WL1, WL2, . . . , WLn−1, WLn, and the at least one string select line SSL.

Referring back to FIGS. 1A to 1D, an insulating spacer 192 that covers a sidewall of the common source line CSL may be formed in the word line cut region WLC. The insulating spacer 192 may electrically insulate the at least one ground select line GSL, the plurality of word lines WL1, WL2, . . . , WLn−1, WLn, the at least one string select line SSL, and the common source line CSL from one another.

In an exemplary embodiment of the inventive concept, the common source line CSL may be formed of a metal such as, for example, tungsten, copper, aluminum, or the like; a conductive metal nitride such as, for example, titanium nitride, tantalum nitride, or the like; a transition metal such as, for example, titanium, tantalum, or the like; a metal silicide such as, for example, nickel silicide, titanium silicide, tungsten silicide, cobalt silicide, or the like; or a combination thereof. However, the material of the common source line CSL is not limited to the above-listed examples.

In an exemplary embodiment of the inventive concept, the insulating spacer 192 may be formed of, for example, silicon oxide, silicon nitride, silicon oxynitride, or a low-dielectric material. The low-dielectric material may have a dielectric constant smaller than the dielectric constant of silicon oxide (e.g., k<3.9). For example, the insulating spacer 192 may be formed of $SiO_2$, $Si_3N_4$, SiON, SiCOH, SiOCN, SiCN, or a combination thereof. In an exemplary embodiment of the inventive concept, the insulating spacer 192 may have a dielectric constant of about 4 to 6, but is not limited thereto.

The ground select line GSL, some of the channel regions 180 adjacent to the ground select line GSL, and some gate dielectric layers 184 may constitute the ground select transistor GST illustrated in FIG. 2. The plurality of word lines WL1, WL2, . . . , WLn−1, WLn, some of the channel regions 180 adjacent to the plurality of word lines WL1, WL2, . . . , WLn−1, WLn, and some of the gate dielectric layers 184 may constitute the plurality of memory cell transistors MC1, MC2, . . . , MCn−1, MCn illustrated in FIG. 2. The string select line SSL, some of the channel regions 180 adjacent to the string select line SSL, and some gate dielectric layers 184 may constitute the string select transistor SST illustrated in FIG. 2.

A plurality of bit line contact pads 186 may be formed on the plurality of channel regions 180. The plurality of bit line contact pads 186 may directly contact upper surfaces of the corresponding channel regions 180, respectively. The plurality of bit line contact pads 186 may serve as drain regions.

In an exemplary embodiment of the inventive concept, the plurality of bit line contact pads 186 may be formed of, for example, an impurity-doped polysilicon, a metal, a conductive metal nitride, or a combination thereof. Examples of the metal for forming the plurality of bit line contact pads 186 are tungsten, nickel, cobalt, tantalum, or the like, but are not limited thereto.

A plurality of bit lines BL may be formed on the plurality of bit line contact pads 186. As illustrated in FIG. 1C, the plurality of bit lines BL may directly contact the upper surfaces of the plurality of bit line contact pads 186, respectively. The plurality of bit lines BL may extend in a direction (the X direction) parallel to the main surface 102M of the substrate 102. A plurality of drain regions of the string select transistors SST of the plurality of memory cell strings MS may be connected to the plurality of bit lines BL through the plurality of bit line contact pads 186.

As illustrated in FIG. 1C, the plurality of channel regions 180 formed to penetrate the at least one ground select line GSL, the plurality of word lines WL, the at least one string select line SSL, may be connected to the plurality of bit lines BL via the bit line contact pads 186. In an exemplary embodiment of the inventive concept, the plurality of bit lines BL may be formed of, for example, an impurity-doped polysilicon, a metal, a conductive metal nitride, or a combination thereof. Examples of the metal for forming the plurality of bit lines BL are tungsten, nickel, cobalt, tantalum, or the like, but are not limited thereto.

As illustrated in FIG. 1D, a plurality of dummy contact pads 186D may be formed on the plurality of dummy channel regions 180D, respectively. The plurality of dummy contact pads 186D may have a structure substantially the same as that of the plurality of bit line contact pads 186, except that the plurality of dummy contact pads 186D may not be connected to the bit lines BL.

A planar layout of the plurality of bit line contact pads 186 and the plurality of dummy contact pads 186D is illustrated in FIG. 1A. As illustrated in FIG. 1A, the plurality of bit line contact pads 186 and the plurality of dummy contact pads 186D may be arranged to form a hexagonal array.

The plurality of channel regions 180 and the plurality of dummy channel regions 180D may be arranged under the plurality of bit line contact pads 186 and the plurality of dummy contact pads 186D, respectively, to have structures the same planar arrangement as those of the plurality of bit line contact pads 186 and the plurality of dummy contact pads 186D, respectively. Although FIG. 1 illustrates the arrangement of the plurality of bit line contact pads 186 and the plurality of dummy contact pads 186D as hexagonal arrays, the inventive concept is not limited to the exemplary embodiment of FIG. 1A. For example, the plurality of bit line contact pads 186, the plurality of dummy contact pads 186D, the plurality of channel regions 180 under the plurality of bit line contacts 186, and the plurality of dummy channel regions 180D under the plurality of dummy contact pads 186D may be arranged in a matrix array.

A first height H11 of the common source line CSL in each of the word line cut regions WLC may be less than a total height of the word line cut region WLC. As used herein, the total height of a word line cut region WLC may be defined as a vertical distance from the main surface 102M of the substrate 102 to the bottom of the bit line BL. The vertical distance refers to a distance in a direction perpendicular to the main surface 102M of the substrate 102.

In an exemplary embodiment of the inventive concept, the first height H11 of the common source line CSL in the word line cut region WLC may be less than a second height H12 of the plurality of channel regions 180 and a third height H13 of the plurality of dummy channel regions 180D. As illustrated in FIGS. 1C and 1D, a first level LV11 of the upper surface of the common source line CSL may be lower than a second level LV12 of the lower surface of the plurality of bit line contact pads 186 and a third level LV13 of the lower surface of the plurality of dummy contact pads 186D, and may be higher than a fourth level LV14 of the upper surface of one of the string select lines SSL that is farthest from the substrate 102. However, the first height H11 of the common source line CSL and the first level LV11 of the upper surface of the common source line CSL are not limited to those illustrated in FIGS. 1C and 1D. For example, the first level LV11 of the upper surface of the common source line CSL and the first height H11 thereof may be freely selected within a range in which the first level LV11 of the upper surface of the common source line CSL is lower than a level of the upper surface of the plurality of channel regions 180. Since the plurality of bit line contact pads 186 are on the plurality of channel regions 180 to contact the plurality of channel regions 180, the level of the upper surface of the plurality of channel regions 180 is the second level LV12 of the lower surface of the plurality of bit line contact pads 186. That is, the first level LV11 may be freely selected within a range in which the first level LV11 is lower than the second level LV12.

A word line cut region buried insulating layer 194 may be formed on the common source line CSL and the insulating spacer 192 in the word line cut region WLC. In an exemplary embodiment of the inventive concept, the word line cut region buried insulating layer 194 may contact the upper surfaces of the common source line CSL and the insulating spacer 192 in the word line cut region WLC.

Figure 4A:
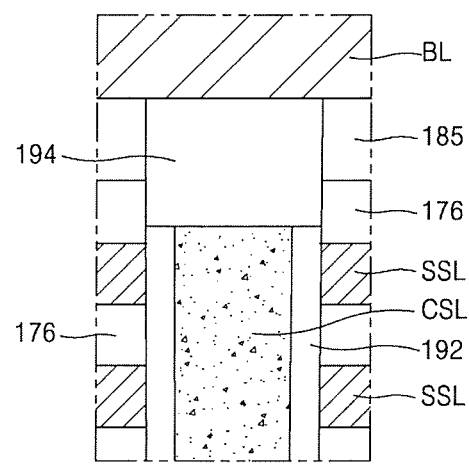
FIGS. 4A to 4C are cross-sectional views illustrating various exemplary structures of a word line cut region buried insulating layer of the IC device according to an exemplary embodiment of the inventive concept.
Figure 4B:
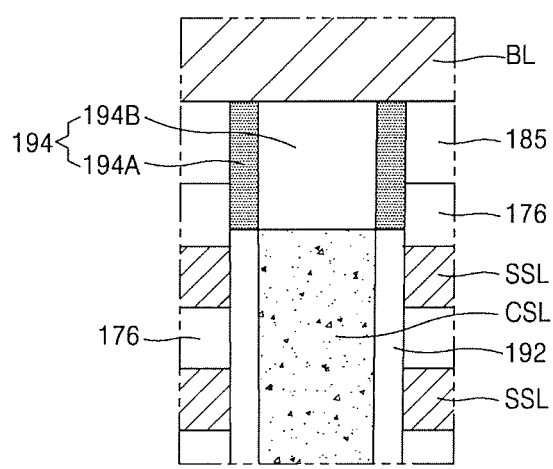
Figure 4C:
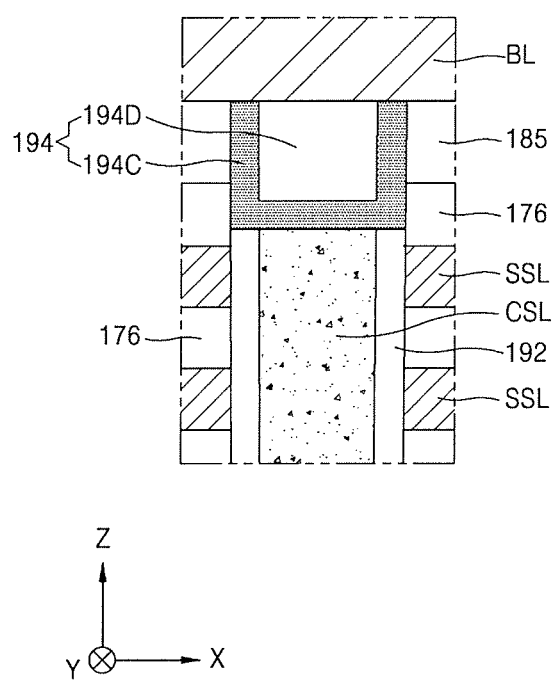

FIGS. 4A to 4C are cross-sectional views illustrating various exemplary structures of the word line cut region buried insulating layer 194 of the IC device 100 described with reference to FIGS. 1A to 1D.

In an exemplary embodiment of the inventive concept, the word line cut region buried insulating layer 194 may include a single layer, as illustrated in FIG. 4A. The word line cut region buried insulating layer 194 may cover the upper surfaces of the common source line CSL and the insulating spacer 192 in the word line cut region WLC. For example, the word line cut region buried insulating layer 194 may be formed of, for example, silicon oxide, silicon nitride, silicon oxynitride, or a low-dielectric material. The low-dielectric material may have a dielectric constant smaller than the dielectric constant of silicon oxide (e.g., k<3.9), and may include, for example, fluorine doped silicon oxide (F—SiO$_2$, k=3.6-3.8), carbon doped silicon oxide (SiCOH, k=2.7-3.0), or porous carbon doped silicon oxide (P—SiCOH, k=2.4 or below). For example, the word line cut region buried insulating layer 194 may be formed of SiO$_2$, Si$_3$N$_4$, SiON, SiOCN, SiCOH, or SiCN. In an exemplary embodiment of the inventive concept, the word line cut region buried insulating layer 194 may have a dielectric constant of about 4 to about 6. However, the inventive concept is not limited thereto.

The word line cut region buried insulating layer 194 may extend in the Y direction parallel to the common source line CSL in the word line cut region WLC.

In an exemplary embodiment of the inventive concept, the word line cut region buried insulating layer 194 may include a multi-layer structure, for example, a first insulating layer 194A and a second insulating layer 194B that are formed of different materials.

The first insulating layer 194A may extend in the Y direction parallel to the common source line CSL, while covering opposite sidewalls of the second insulating layer 194B in the word line cut region WLC. The second insulating layer 194B may extend in the Y direction parallel to the common source line CSL in the word line cut region WLC.

In an exemplary embodiment of the inventive concept, the first insulating layer 194A may be formed of silicon nitride or silicon oxynitride, and the second insulating layer 194B may be formed of silicon oxide. In an exemplary embodiment of the inventive concept, the first insulating layer 194A and the second insulating layer 194B may include different material layers, for example, materials selected from SiO$_2$, Si$_3$N$_4$, SiON, SiOCN, SiCOH, and SiCN. However, materials for forming the first insulating layer 194A and the second insulating layer 194B are not limited to the above-listed materials.

In an exemplary embodiment of the inventive concept, the word line cut region buried insulating layer 194 may include a double layer including a third insulating layer 194C and a fourth insulating layer 194D that are formed of different materials.

The third insulating layer 194C may extend in the Y direction parallel to the common source line CSL, while covering both sidewalls and the lower surface of the fourth insulating layer 194D in the word line cut region WLC. The fourth insulating layer 194D may extend in the Y direction parallel to the common source line CSL in a space defined by the third insulating layer 194C. The fourth insulating layer 194D may be separated from the common source line CSL with the third insulating layer 194C therebetween.

In an exemplary embodiment of the inventive concept, the third insulating layer 194C may be formed of silicon nitride or silicon oxynitride. The fourth insulating layer 194D may be formed of silicon oxide. In an exemplary embodiment of the inventive concept, the third insulating layer 194C and the fourth insulating layer 194D may be formed of different materials, for example, materials selected from SiO$_2$, Si$_3$N$_4$, SiON, SiOCN, SiCOH, and SiCN. However, materials for forming the third insulating layer 194C and the fourth insulating layer 194D are not limited to the above-listed materials.

Embodiments of the word line cut region buried insulating layer 194 including as a single layer or as a double layer are described with reference to FIGS. 4A to 4C. However, the inventive concept is not limited thereto. For example, the word line cut region buried insulating layer 194 may include a multi-layer structure including more than two insulating layers of different materials, for example, a triple layer or a quadruple layer.

A width of the word line cut region buried insulating layer 194 in the X direction parallel to the extending direction of the plurality of bit lines BL may be greater than the width of the common source line CSL.

Referring back to FIGS. 1A to 1D, a plurality of common source via contacts 198 (refer to FIG. 1D) may be formed on the common source lines CSL in the word line cut region WLC, respectively.

The plurality of common source via contacts 198 may contact the common source lines CSL, respectively, in the common source line tab region CSL TAB. The plurality of common source via contacts 198 may pass through the word line cut region buried insulating layer 194, a first upper insulating layer 195, and a second upper insulating layer 196 in a direction away from the substrate 102. Accordingly, the plurality of common source via contacts 198 may protrude from internal space in the word line cut region WLC. A distance from the substrate 102 to the upper surface of the common source via contact 198 may be greater than the distance from the substrate 102 to the upper surface of the bit line contact pad 186 and the distance from the substrate 102 to the upper surface of the bit lines BL.

The common source line CSL may have a linear shape extending along a direction parallel to the main surface 102M of the substrate 102 in the word line cut region WLC, while the plurality of common source via contacts 198 may have a plug shape extending in some of the local regions on the upper surface of the common source line CSL, in a direction (the Z direction) perpendicular to the substrate 102.

The plurality of common source via contacts 198 may each be surrounded by a word line cut region buried insulating layer 194 in the word line cut region WLC of the common source line tab region CSL TAB.

In an exemplary embodiment of the inventive concept, the plurality of common source via contacts 198 may be formed of, for example, a metal, a metal silicide, an impurity-doped semiconductor, or a combination thereof. For example, the plurality of common source via contacts 198 may include a metal, such as tungsten, nickel, cobalt, titanium, tantalum, or the like; a metal silicide, such as tungsten silicide, nickel silicide, cobalt silicide, titanium silicide, tantalum silicide, or the like; an impurity-doped polysilicon; or a combination thereof. However, the inventive concept is not limited thereto.

The first upper insulating layer 195 may have a plurality of line-shaped openings that are filled with the plurality of bit lines BL, respectively. The second upper insulating layer 196 may extend to cover the plurality of bit lines BL. The plurality of common source via contacts 198 may extend through a plurality of via contact holes 198H (see FIG. 10I) formed through the second upper insulating layers 196.

The IC device 100 described with reference to FIGS. 1A to 1D may have a reduced number of wiring layers on the plurality of bit lines BL in the memory cell array region 12. In particular, the number of wiring layers formed on the plurality of bit lines BL may be reduced to just one. Accordingly, the manufacturing process of the IC device 100 may be simplified. Since the number of metal wiring layers in the memory cell array region 12 may be reduced, physical stress on the IC device caused from metal wires may be reduced, consequentially preventing warpage of the substrate 102. Physical stress created may cause dislocation defect in the semiconductor substrate, and may cause wafer warpage or even wafer cracking. Due to the inclusion of the common source lines CSL partially filling the word line cut regions WLC of the memory cell array region 12, the volume of metal in the word line cut regions WLC may be reduced. Accordingly, physical stress on the IC device 100 may be reduced, so that deformation of the IC device 100, caused by physical stress, and consequential occurrence of unwanted defects may be prevented.

Figure 5A:
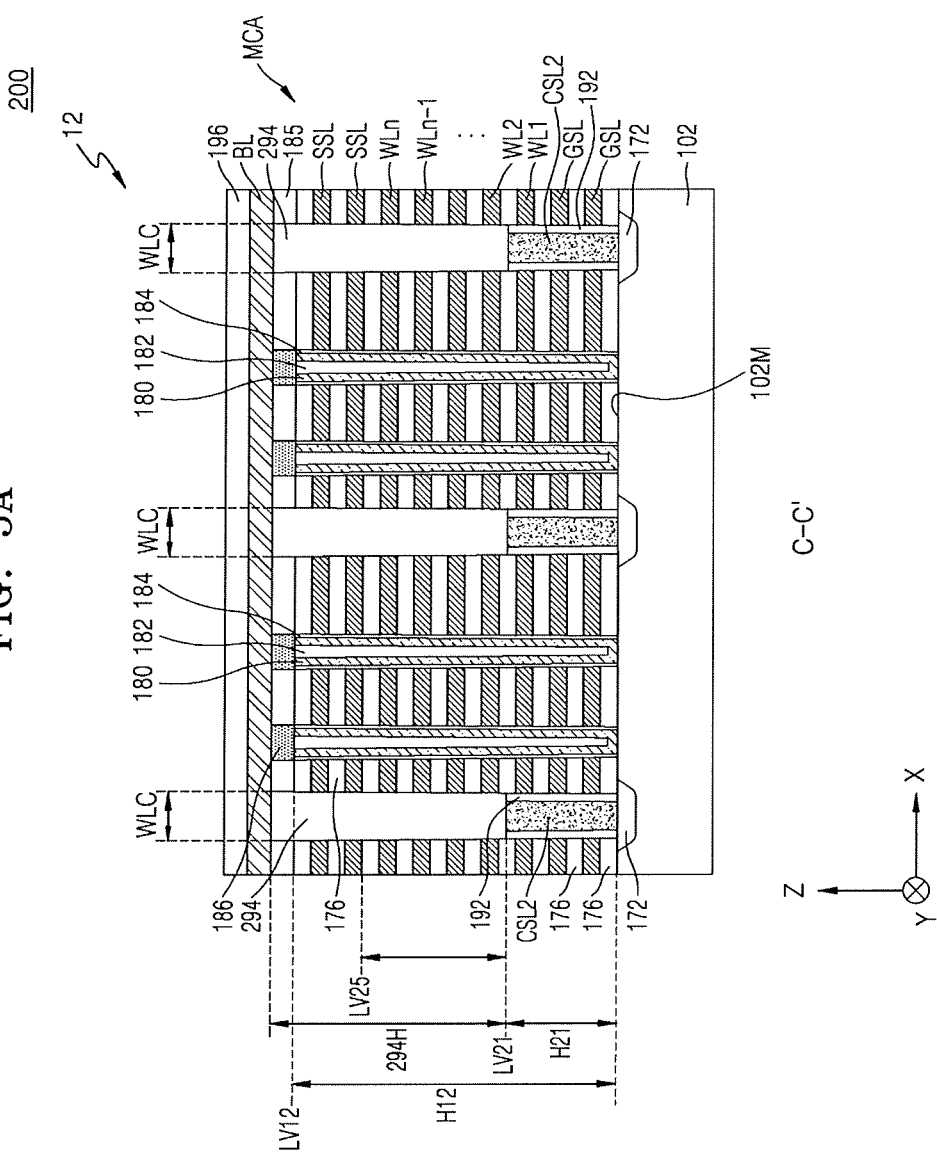
FIGS. 5A and 5B are views illustrating an IC device according to an exemplary embodiment of the inventive concept, and in particular.
Figure 5B:
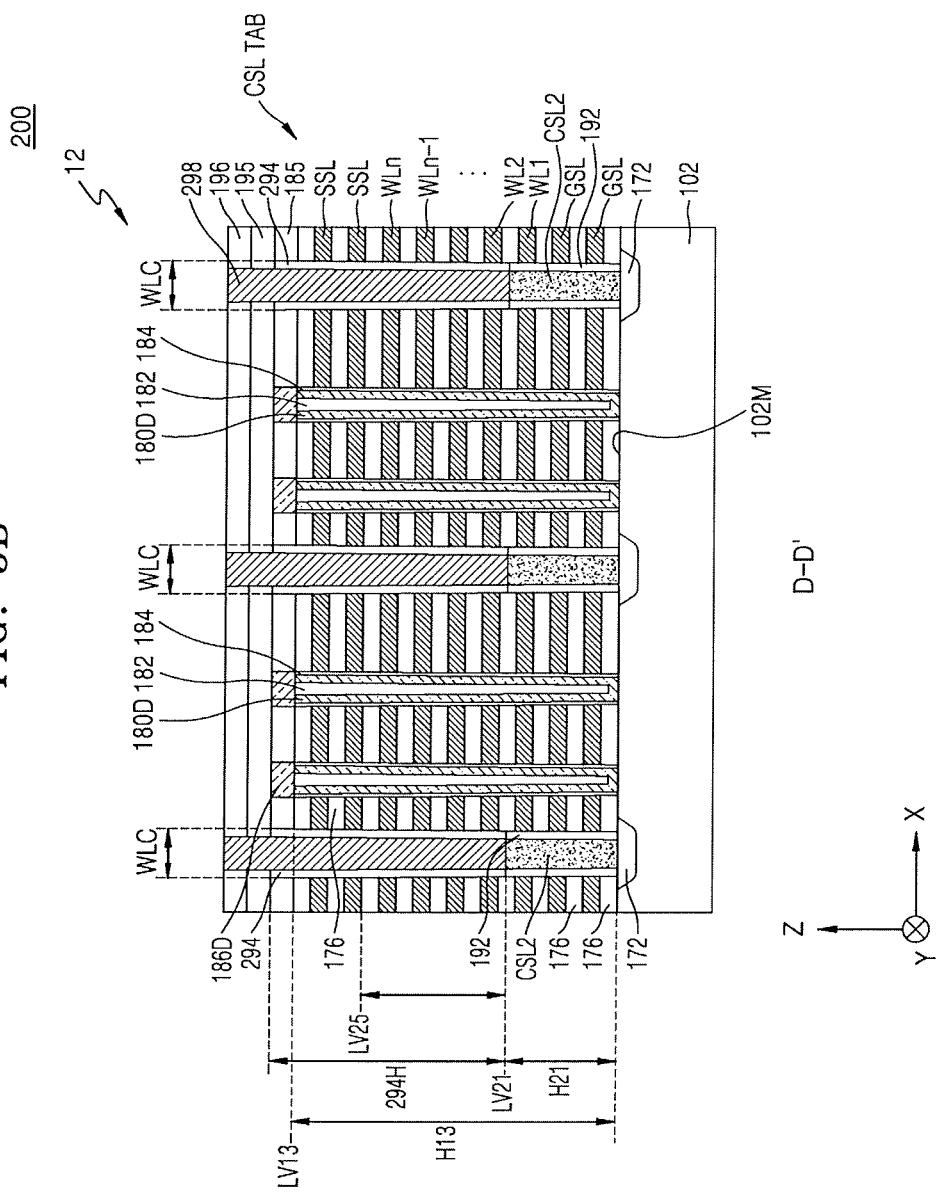

FIGS. 5A and 5B are views illustrating an IC device 200 according to an exemplary embodiment of the inventive concept. In particular, FIG. 5A is a schematic cross-sectional view of a structure of a region of the IC device 200 corresponding to the region taken along line C-C' in FIG. 1A. FIG. 5B is a schematic cross-sectional view of a structure of a region of the IC device 200 corresponding to the region taken along line D-D' in FIG. 1A.

The IC device 200 illustrated in FIGS. 5A and 5B may have structures substantially the same as those of the IC device 100 of FIGS. 1A to 1D, except that the IC device 200 may include common source lines CSL2 having a first height H21 less than the first height H11 (refer to FIGS. 1C and 1D) of the common source lines CSL illustrated in FIGS. 1A to 1D, and word line cut region buried insulating layers 294 having a height 294H greater than the height of the word line cut region buried insulating layers 194.

In an exemplary embodiment of the inventive concept, the first height H21 of the common source lines CSL2 of the IC device 200 may be less than two thirds (⅔) of a total height of the word line cut regions WLC defined as the vertical distance from the main surface 102M of the substrate 102 to the lower surface of the bit lines BL. The height 294H of the word line cut region buried insulating layer 294 may be greater than one third (⅓) of the total height of the word line cut regions WLC. In an exemplary embodiment of the inventive concept, the first height H21 of the common source lines CSL2 in the IC device 200 may be less than half (½) of the total height of the word line cut regions WLC, and the height 294H of the word line cut region buried insulating layer 294 may be greater than half (½) of the total height of the word line cut regions WLC. However, the first height H21 of the common source line CSL2 and the height 294H of the word line cut region buried insulating layer 294 are not limited to the above.

The first height H21 of the common source lines CSL2 in the word line cut regions WLC may be less than a second height H12 of the plurality of channel regions 180 and a third height H13 of the plurality of dummy channel regions 180D. A first level LV21 of the upper surface of the common source lines CSL2 may be lower than a second level LV12 of the lower surface of the plurality of bit line contact pads 186 and a third level LV13 of the lower surface of the plurality of dummy contact pads 186D, and lower than a fifth level LV25 of the lower surface of one of the string select lines SSL that is closest to the substrate 102. Since the plurality of bit line contact pads 186 are on the plurality of channel regions 180 to contact the plurality of channel regions 180, the level of the upper surface of the plurality of channel regions 180 is the second level LV12 of the lower surface of the plurality of bit line contact pads 186. Since the plurality of dummy contact pads 186D are on the plurality of dummy channel regions 180D to contact the plurality of dummy channel regions 180D, the level of the upper surface of the plurality of dummy channel regions 180D is the third level LV13 of the lower surface of the plurality of bit line contact pads 186. That is, the first level LV21 of the upper surface of the common source lines CSL2 may be lower than a second level LV12 of the upper surface of the plurality of channel regions 180 and a third level LV13 of the upper surface of the plurality of dummy channel regions 180D. The word line cut region buried insulating layers 294 may have a sidewall facing a pair of string select lines SSL.

In the IC device 200 illustrated in FIGS. 5A and 5B, the height of the common source lines CSL formed in the word line cut regions WLC of the memory cell array region 12 may be less than half (½) the total height of the word line cut regions WLC, so that the volume of metal in the word line cut regions WLC may be markedly reduced, and consequentially, physical stress on the IC device 100 may also be markedly reduced.

Figure 6A:
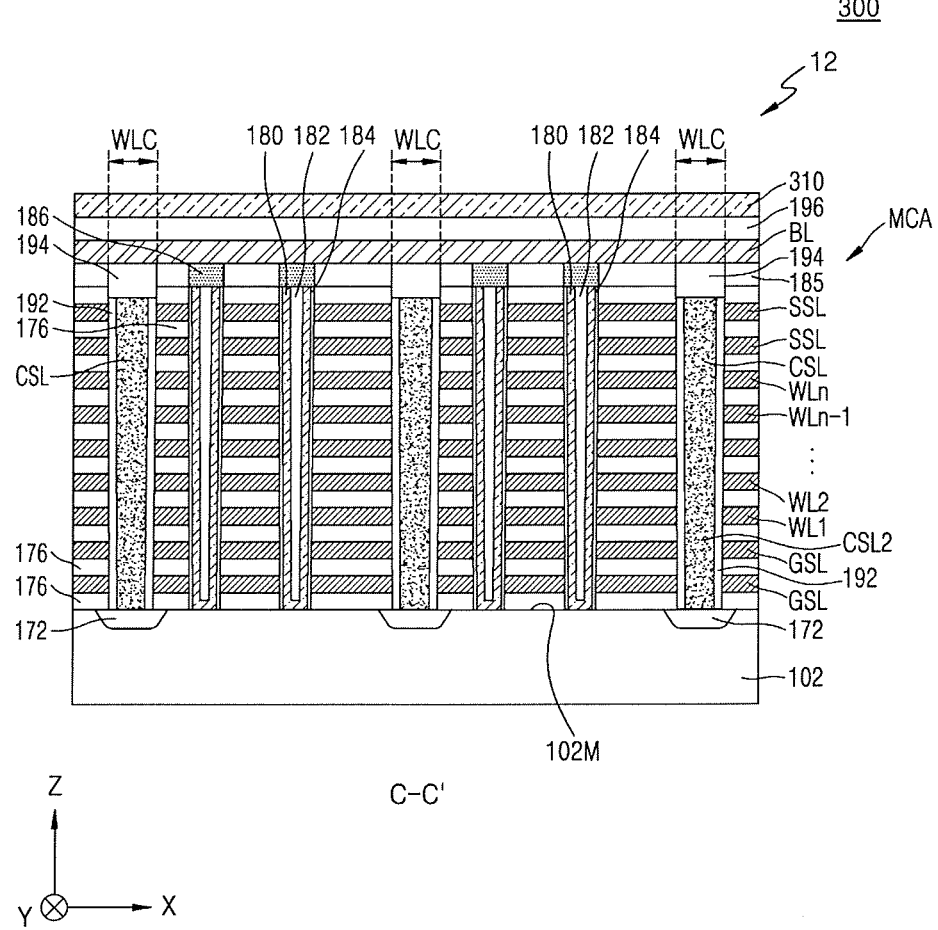
FIGS. 6A and 6B are views illustrating an IC device according to an exemplary embodiment of the inventive concept, and in particular.
Figure 6B:
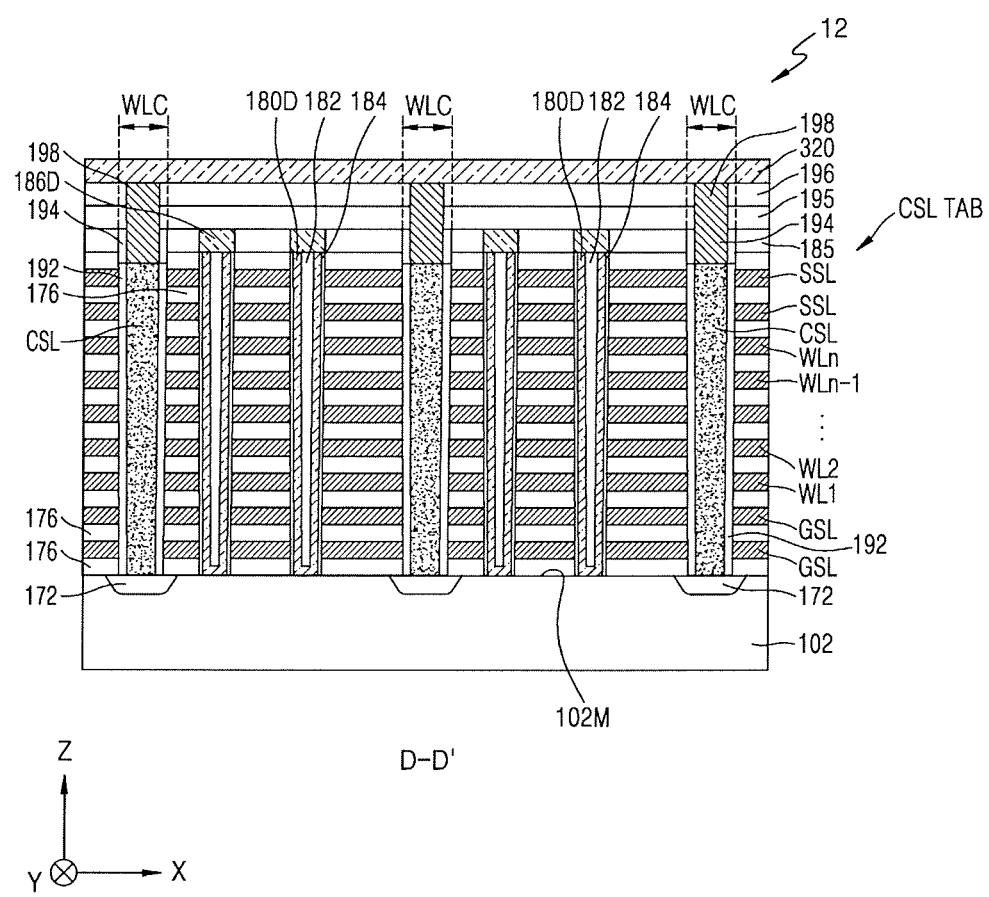

FIGS. 6A and 6B are views illustrating an IC device 300 according to an exemplary embodiment of the inventive concept. In particular, FIG. 6A is a schematic cross-sectional view of a structure of a region of the IC device 300 corresponding to the region taken along line C-C' in FIG. 1A. FIG. 6B is a schematic cross-sectional view of a structure of a region of the IC device 300 corresponding to the region taken along line D-D' in FIG. 1A.

The IC device 300 illustrated in FIGS. 6A and 6B may have structures substantially the same as those of the IC device 100 of FIGS. 1A to 1D, except that the IC device 300 may further include first and second upper wiring layers 310 and 320 disposed on the plurality of common source via contacts 198 to be connected to the same.

The first and second upper wiring layers 310 and 320 may be at the same level on the substrate 102. The first upper wiring layer 310 may be formed on the plurality of channels regions 180 and may cover the bit lines BL, and the second upper wiring layer 320 may be formed on the plurality of dummy channel regions 180D and may contact the plurality of common source via contacts 198. The second upper insulating layer 196 may be interposed between the first upper wiring layer 310 and the bit lines BL in the memory cell array MCA.

In an exemplary embodiment of the inventive concept, the second upper wiring layer 320 may be formed only in the common source line tab region CSL TAB. In an exemplary embodiment of the inventive concept, the first upper wiring layer 310 and the second upper wiring layer 320 may be separated from one another.

In an exemplary embodiment of the inventive concept, the first upper wiring layer 310 and the second upper wiring layer 320 may be interconnected as a single body. For example, the first upper wiring layer 310 and the second upper wiring layer 320 together may form one metal wiring layer having a mesh-like planar structure.

Figure 7:
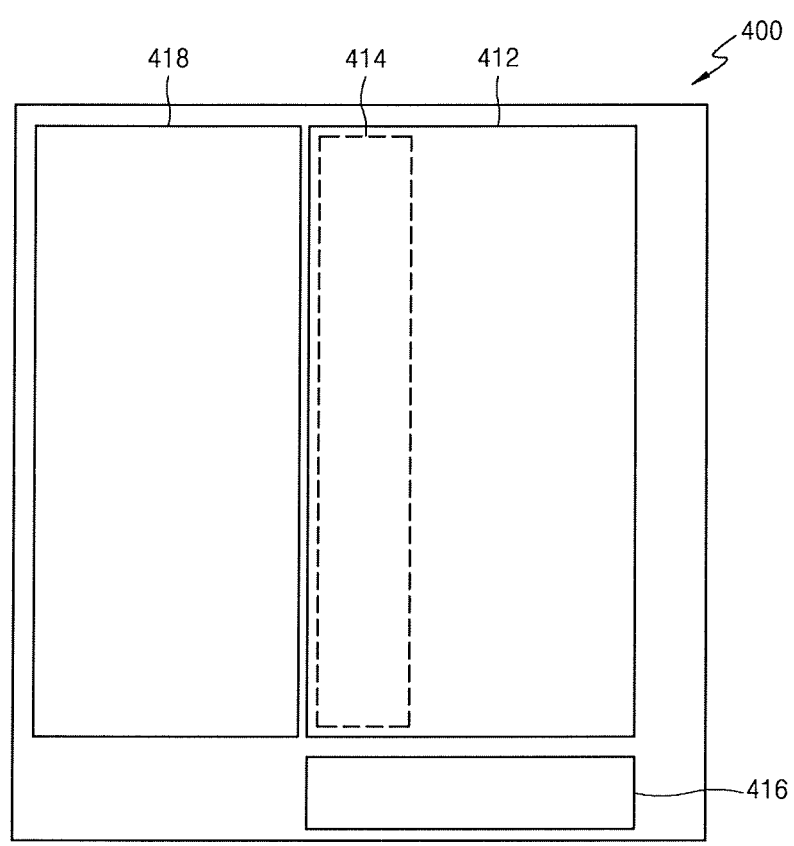
FIG. 7 is a planar layout diagram of main regions of an IC device according to an exemplary embodiment of the inventive concept.

FIG. 7 is a planar layout diagram of main regions of an IC device 400 according to an exemplary embodiment of the inventive concept.

Referring to FIG. 7, the IC device 400 may include a memory cell array region 412, a first peripheral circuit region 414, a second peripheral circuit region 416, and a bonding pad region 418.

The memory cell array region 412 may include a plurality of memory cell arrays MCA and common source line tab regions CSL TAB, which have the same configuration as those illustrated in FIGS. 1A and 2.

The memory cell array region 412 may have a configuration substantially the same as that of the memory cell array region 12 described with reference to FIGS. 1A to 1D.

The first peripheral circuit region 414 and the second peripheral circuit region 416 may include control units for controlling data input to or data output from the memory cell array region 412. Peripheral circuits for driving vertical memory cells included in the memory cell array region 412 may be disposed in the first peripheral circuit region 414 and the second peripheral circuit region 416.

The first peripheral circuit region 414 may vertically overlap the memory cell array region 412 and thus reduce a planar area of a chip including the IC device 400.

In an exemplary embodiment of the inventive concept, peripheral circuits disposed in the first peripheral circuit region 414 may be circuits that process data, which are input to or output from the memory cell array region 412, at high speed. For example, peripheral circuits disposed in the first peripheral circuit region 414 may be a page buffer, a latch circuit, a cache circuit, a column decoder, a sense amplifier, a data input/output (I/O) circuit, or the like.

The second peripheral circuit region 416 may be disposed in a region on one side of the memory cell array region 412 not to overlap the memory cell array region 412 and/or the first peripheral circuit region 414. Peripheral circuits formed in the second peripheral circuit region 416 may be, for example, a row decoder. In an exemplary embodiment of the inventive concept, unlike the illustration in FIG. 7, the second peripheral circuit region 416 may be disposed under the memory cell array region 412.

The bonding pad region 418 may be formed on another side of the memory cell array region 412. The bonding pad region 418 may be a region, for example, in which interconnection lines connected to word lines of vertical memory cells of the memory cell array region 412 are formed.

Figure 8A:
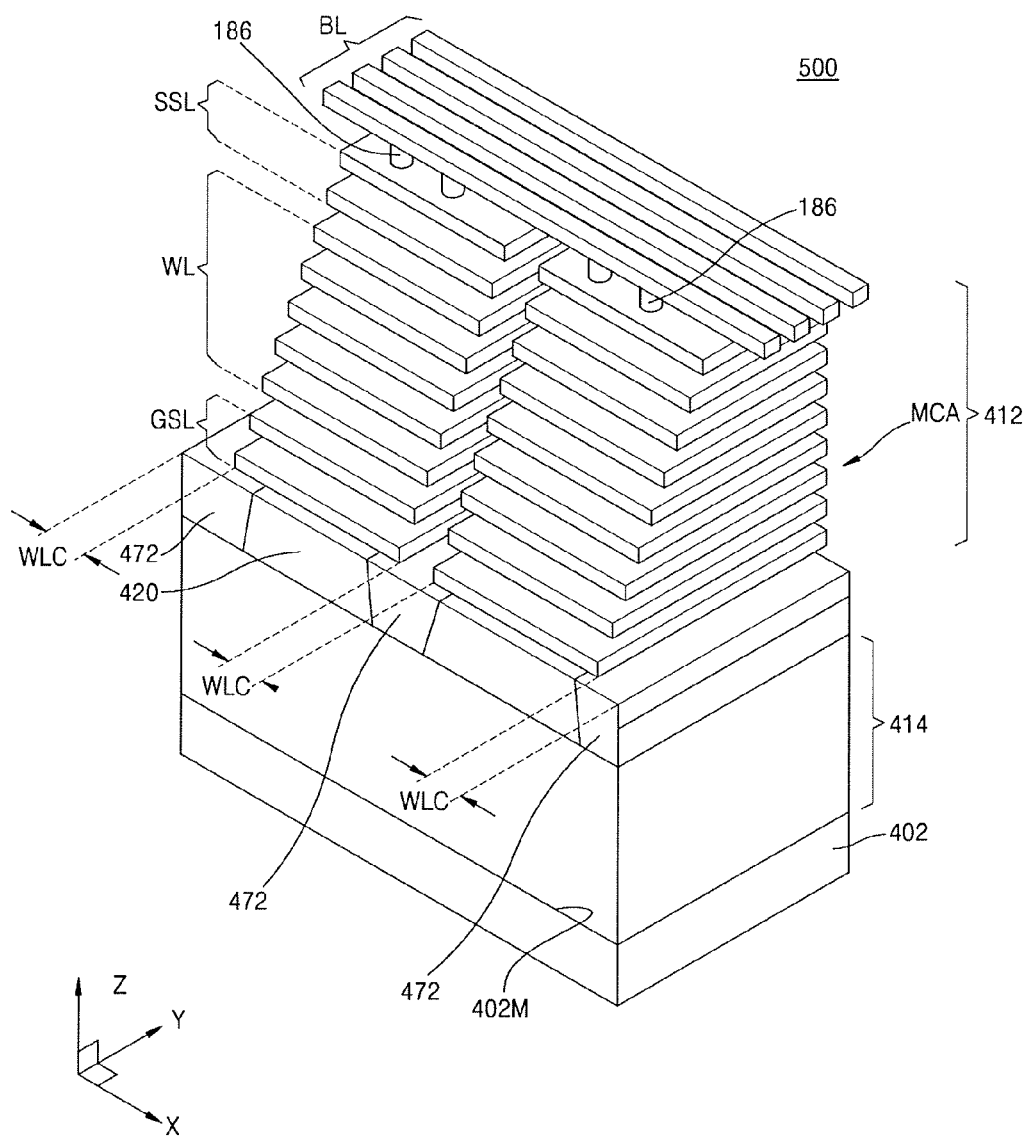
FIGS. 8A to 8C are schematic views illustrating an IC device according to an exemplary embodiment of the inventive concept, and in particular.
Figure 8B:
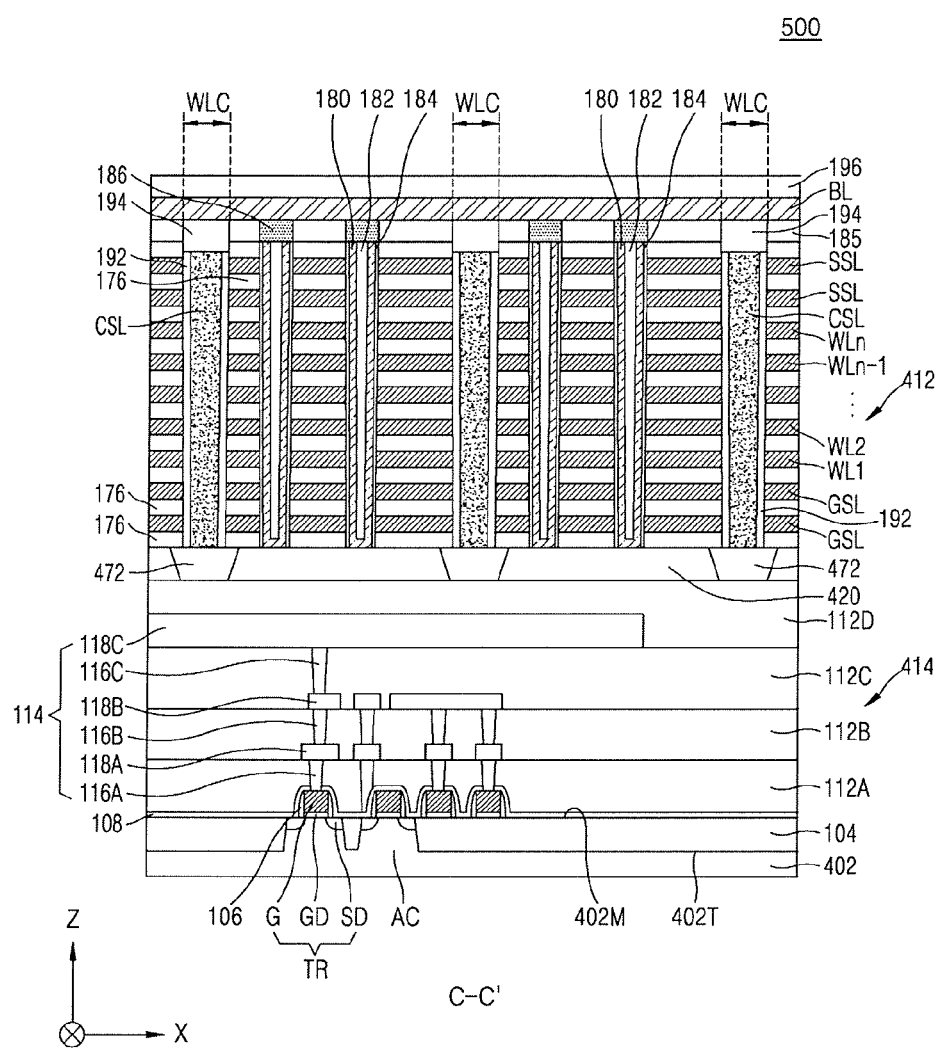
Figure 8C:
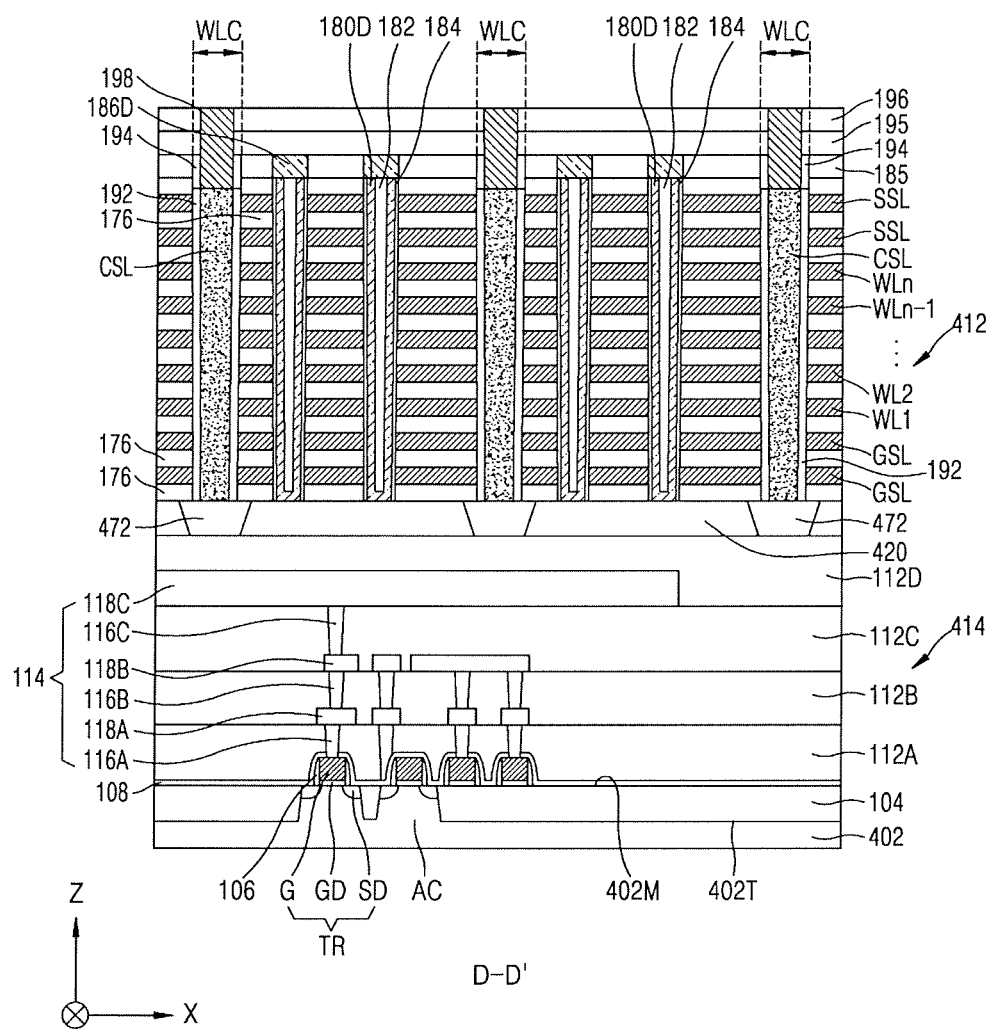

FIGS. 8A to 8C are schematic diagrams illustrating an IC device 500 according to an exemplary embodiment of the inventive concept. The IC device 500 of FIGS. 8A to 8C may have a planar layout the same as that of the IC device 400 of FIG. 7. In particular, FIG. 8A is a schematic perspective view of main elements in a region of the IC device 500 corresponding to the region "1B" of FIG. 1A. FIG. 8B is a schematic cross-sectional view of a portion of the IC device 500 corresponding to the region taken along C-C' in FIG. 1A. FIG. 8C is a schematic cross-sectional view of a portion of the IC device 500 corresponding to the region taken along D-D' in FIG. 1A.

In the IC device 500 of FIGS. 8A to 8C, the memory cell array region 412 may have a structure substantially the same as that of the memory cell array region 12 of the IC device 100 illustrated in FIGS. 1A to 1D. In FIGS. 8A to 8C, like reference numerals as those in FIGS. 1A to 1D denote like elements, and thus detailed description thereof will be omitted.

Referring to FIGS. 8A to 8C, the IC device 500 includes a first peripheral circuit region 414 formed at a first level on a substrate 402, and a memory cell array region 412 formed at a second level on the substrate 402, in which the second level is higher than the first level.

The term "level" used herein means a height from the substrate 402 in a vertical direction (the Z direction in FIGS. 8A to 8C). The first level on the substrate 402 is closer to the substrate 402 than the second level to the substrate 402.

In an exemplary embodiment of the inventive concept, the substrate 402 may have a main surface 402M extending in the X direction and the Y direction. Details of the substrate 402 may be substantially the same as those of the substrate 102 described with reference to FIGS. 1A to 1D.

In the substrate 402, an active region AC for peripheral circuits may be defined by a device isolation layer 104. A plurality of transistors TR of the first peripheral circuit region 414 may be formed on the active region AC of the substrate 402. The plurality of transistors TR may each include a gate G, a gate insulating layer GD, and a source/drain region SD. Opposite sidewalls of the gate G may be covered with an insulating spacer 106, and an etch stop layer 108 may be formed on the gate G and the insulating spacer 106. The etch stop layer 108 may include an insulating material, such as, for example, silicon nitride or silicon oxynitride.

A plurality of interlayer insulating layers 112A, 112B, 112C, and 112D may be sequentially stacked on the etch stop layer 108. The plurality of interlayer insulating layers 112A, 112B, 112C, and 112D may include, for example, silicon oxide, silicon nitride, or silicon oxynitride.

The first peripheral circuit region 414 may include a multilayer wiring structure 114 that is electrically connected to the plurality of transistors TR. The multilayer wiring structure 114 may be insulated by the plurality of interlayer insulating layers 112A, 112B, 112C, and 112D.

The multilayer wiring structure 114 may include a first contact 116A, a first wiring layer 118A, a second contact 116B, a second wiring layer 118B, a third contact 116C, and a third wiring layer 118C, which may be sequentially stacked on the substrate 402 and be electrically connected to each other. In an exemplary embodiment of the inventive concept, the first wiring layer 118A, the second wiring layer 118B, and the third wiring layer 118C may be formed of a conductive material, such as, for example, metal, conductive metal nitride, metal silicide, or a combination thereof. For example, the first wiring layer 118A, the second wiring layer 118B, and the third wiring 118C may include a conductive material, such as tungsten, molybdenum, titanium, cobalt, tantalum, nickel, tungsten silicide, titanium silicide, cobalt silicide, tantalum silicide, or nickel silicide.

Although the multilayer wiring structure 114 in FIGS. 8B and 8C is a triple-layer wiring structure including the first wiring layer 118A, the second wiring layer 118B, and the third wiring layer 118C, the inventive concept is not limited thereto. For example, the multilayer wiring structure 114 may be a multilayer wiring structure including two layers or four or more layers according to a layout of the first peripheral circuit region 414 and a type and arrangement of the gate G.

A semiconductor layer 420 covering the plurality of interlayer insulating layers 112A, 112B, 112C, and 112D may be formed on the first peripheral circuit region 414. The memory cell array region 412 may be formed on the semiconductor layer 420. The memory cell array region 412 may have a structure substantially the same as that of the memory cell array region 12 of the IC device 100 described with reference to FIGS. 1A to 1D.

The semiconductor layer 420 may be formed of, for example, Si, Ge, or a combination thereof. The semiconductor layer 420 may be formed of, for example, an impurity-doped semiconductor or an undoped intrinsic semiconductor. The impurity-doped semiconductor may be an n-type impurity doped semiconductor or a p-type impurity doped semiconductor. The semiconductor layer 420 may have, for example, a single crystalline structure, an amorphous structure, or a polycrystalline structure.

A plurality of common source regions 472 may be formed in the semiconductor layer 420. A detailed structure of the plurality of common source regions 472 is substantially the same as that of the plurality of common source regions 172 described with reference to FIGS. 1A to 1D.

The plurality of common source regions 472 may be formed in the semiconductor layer 420 by doping with impurities. As illustrated in FIGS. 8B and 8C, a depth of the plurality of common source regions 472 may be substantially the same as the thickness of the semiconductor layer 420. Accordingly, the bottom surfaces of the plurality of common source regions 472 may contact the uppermost interlayer insulating layer of the plurality of interlayer insulating layers 112A, 112B, 112C, and 112D in the first peripheral circuit region 414. In an exemplary embodiment of the inventive concept, the plurality of common source regions 472 may be impurity regions highly doped with, for example, n-type impurities. The n-type impurities may include, for example, phosphorus, arsenic, antimony, or bismuth. The plurality of common source regions 472 may have a conductive type that is different from that of the semiconductor layer 420. For example, the plurality of common source regions 472 may have a p-type conductivity, while the semiconductor layer 420 may have an n-type conductivity, or vice versa.

In the IC device 500, the memory cell array region 412 and the first peripheral circuit region 414 may be electrically connected to one another via at least one connection plug extending in a vertical direction (the Z direction). The at least one connection plug may be formed to penetrate at least some of the plurality of interlayer insulating layers 112A, 112B, 112C, and 112D of the first peripheral circuit region 414, and the semiconductor layer 420. Wiring structures formed in the memory cell array region 412 by the at least one connection plug may be electrically connected with wiring structures formed in the first peripheral circuit region 414.

The IC device 500 illustrated in FIGS. 8A to 8C may have a multilayer device structure in which a first level semiconductor device and a second level semiconductor device having different functions may be stacked upon one another to overlap in a direction perpendicular to the main surface 402M of the substrate 402. Accordingly, the multilayer wiring structures on the plurality of common source lines CSL and the plurality of channel regions 180 in the memory cell array region 412 may have a smaller number of layers. This may prevent excessive density increase of wiring patterns of the multilayer wiring structures in the memory cell array region 412 and simplify the manufacturing process of the IC device. Due to the reduced number of layers of the multilayer wiring structure, physical stress caused from the metal wirings may also be reduced, thus preventing warpage of the substrate 402.

Figure 9A:
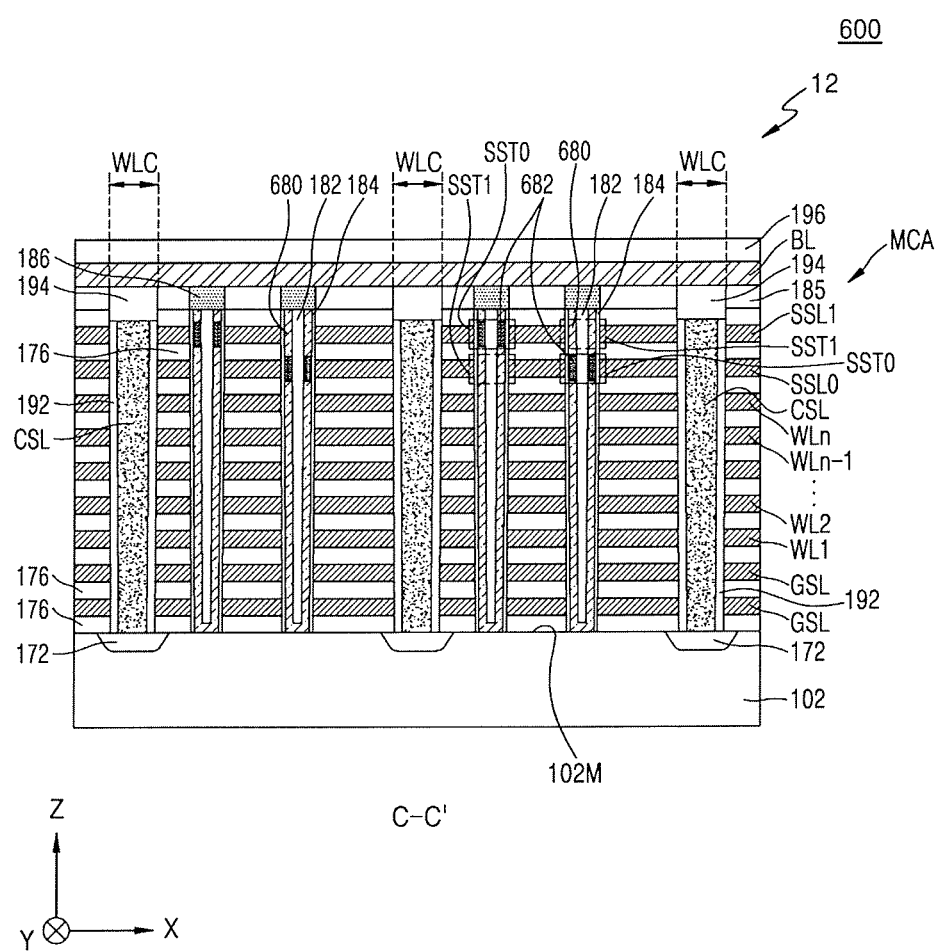
FIGS. 9A and 9B are cross-sectional views illustrating an IC device according to an exemplary embodiment of the inventive concept.
Figure 9B:
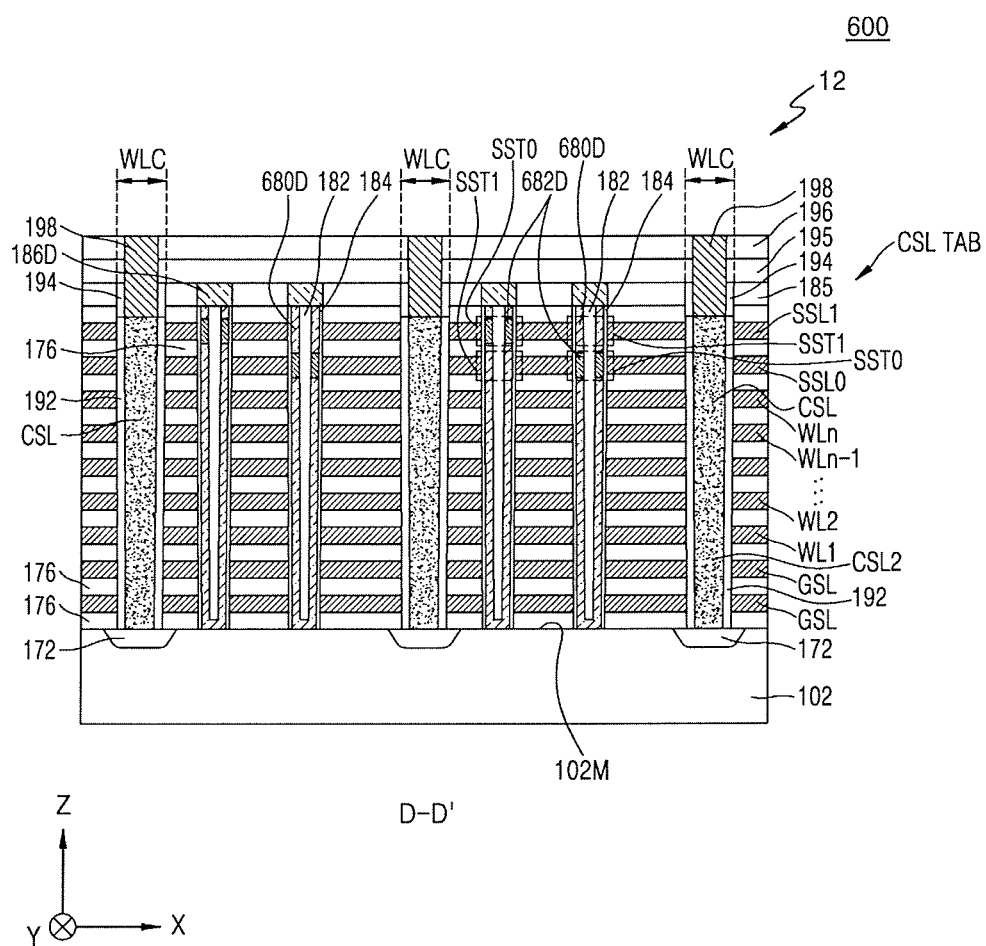

FIGS. 9A and 9B are cross-sectional views illustrating an IC device 600 according to an exemplary embodiment of the inventive concept. In FIGS. 9A and 9B, like reference numerals as those in FIGS. 1A to 1D denote like elements, and thus detailed description thereof will be omitted.

The IC device 600 illustrated in FIGS. 9A and 9B may have a structure substantially the same as that of the IC device 100 illustrated in FIGS. 1A to 1D, except that the plurality of memory cell arrays MCA in the IC device 600 may include a first string select transistor SST0 and a second string select transistor SST1 having different threshold voltages. To implement the first string select transistor SST0 and the second string select transistor SST1 having different threshold voltages, a plurality of channel regions 680 may include a plurality of doped channel regions 682 that are locally doped at a doping concentration higher than that of the other regions of the plurality of channel regions 680. Similarly, in the common source line tab regions CSL TAB, a plurality of dummy channel regions 680D may include a plurality of dummy doped channel region 682D that are locally doped at a doping concentration higher than that of the other regions in the plurality of dummy channel regions

680D. Due to this structure, a first string select transistor SST0 and a second string select transistor SST1 having different threshold voltages may be formed in the common source line tab regions CSL TAB. The first string select transistor SST0 and the second string select transistor SST1 formed in the common source line tab region CSL TAB may not function as a transistor.

In the IC device 600 illustrated in FIGS. 9A and 9B, a plurality of ground select lines GSL and a plurality of word lines WL, which are between the plurality of common source regions 172 on the substrate 102 and the plurality of bit lines BL over the substrate 102, may be used as gate electrodes of the plurality of ground select transistors GST and the plurality of memory cell transistors MC1, MC2, . . . , MCn−1, MCn (refer to FIG. 2). First and second string select lines SSL0 and SSL1 may be used as gate electrodes of the first and second string select transistors SST0 and SST1.

The first and second string select lines SSL0 and SSL1 may control electrical connection between the plurality of bit lines BL and the plurality of memory cell strings MS. The ground select lines GSL may control electrical connection between the plurality of memory cell strings MS and the plurality of common source lines CSL.

The first and second string select lines SSL0 and SSL1 shared by the plurality of memory cell strings MS may be connected to at least one of the first string select transistors SST0 and at least one of the second string select transistors SST1, respectively. A first string select transistor SST0 of one memory cell string MS and a second string select transistor SST1 of another adjacent memory cell string MS may be controlled by one first string select line SSL0 or one second string select line SSL1. The first and second string select transistors SST0 and SST1 controlled by the first or second string select line SSL0 or SSL1 may have different threshold voltages, and may perform different operations according to a voltage applied to the first or second string select line SSL0 or SSL1. Accordingly, one of the plurality of memory cell strings MS may be electrically connected to a bit line BL according to the voltage applied to the first or second string select line SSL0 or SSL1. In this manner, electrical connection between one memory cell string selected from the plurality of memory cell strings MS and a bit line BL may be selectively controlled.

To implement the first and second string select transistor SST0 and SST1 having different threshold voltages with the first and second string select lines SSL0 and SSL1, some channel regions 680 selected from the plurality of channel regions 680 and some dummy channel regions 680D selected from the plurality of dummy channel regions 680D may be locally, i.e., only regions adjacent to the second string select line SSL1, doped with impurity ions to form doped channel regions 682 and dummy doped channel regions 682D. Some channel regions 680 selected from the plurality of channel regions 680 and some dummy channel regions 680D selected from the plurality of dummy channel regions 680D may be locally, i.e., only regions adjacent to the first string select line SSL0, doped with impurity ions to form doped channel regions 682 and dummy doped channel regions 682D. Impurity ions doped in the doped channel regions 682 and the dummy doped channel regions 682D may be n-type or p-type impurities.

In an exemplary embodiment of the inventive concept, the other regions in the plurality of channel regions 680 and the plurality of dummy channel regions 680D, except for the doped channel regions 682 and the dummy doped channel regions 682D, may be formed of an undoped intrinsic semiconductor, for example, an undoped polysilicon. Thus, when the plurality of channel regions 680 and the plurality of dummy channel regions 680D include no doped channel region 682 and no dummy doped channel region 682D, respectively, the first and second string select transistors SST0 and SST1 may have substantially the same threshold voltage.

As described above, the regions of a channel region 680 and a dummy channel region 680D adjacent to the first string select line SSL0 may have a different impurity concentration from the regions adjacent to the second string select line SSL1. Accordingly, the first and second string select transistors SST0 and SST1 having different threshold voltages may be implemented with the first and second string select lines SSL0 and SSL1 and the plurality of channel regions 680 penetrating the first and second string select lines SSL0 and SSL1.

To implement a configuration in which a first threshold voltage of the first string select transistor SST0 is higher than a second threshold voltage of the second string select transistor SST1, a doped channel region 682 may be formed by doping an undoped channel region 680 with p-type impurities. Alternatively, the other regions of the plurality of channel regions 680 and the plurality of dummy channel regions 680D, except for the doped channel regions 682 and the dummy doped channel regions 682D may be formed of an n-type impurity doped semiconductor, and the doped channel regions 682 and the dummy doped channel regions 682D may be formed of p-type impurity doped semiconductor. In this case, the plurality of channel regions 680 and the plurality of dummy channel regions 680D may include the doped channel regions 682 and the dummy doped channel regions 682D adjacent to the first or second string select line SSL0 or SSL1, wherein channels of opposite conductivity types may be formed in adjacent two of the doped channel regions 682 or the dummy doped channel regions 682D, respectively. The channel regions of the first and second string select transistors SST0 and SST1 formed, respectively, in a channel region 680 and a dummy channel region 680D may have opposite conductivity types, and the first and second string select transistor SST0 and SST1 may have a further increased difference in threshold voltage.

To implement a configuration in which the threshold voltage of a first string select transistor SST0 is less than the threshold voltage of a second string select transistor SST1, a doped channel region 682 may be formed by doping a channel region 680 with n-type impurities.

In an exemplary embodiment of the inventive concept, the thickness of each of the first and second string select lines SSL0 and SSL1 may be the same as the thickness of each of the plurality of word lines WL. In an exemplary embodiment of the inventive concept, the thickness of the first and second string select lines SSL0, SSL1 may be greater than the thickness of the plurality of word lines WL.

FIGS. 10A to 10J are cross-sectional views that sequentially illustrate a method of manufacturing an IC device, according to an exemplary embodiment of the inventive concept. In the current exemplary embodiment, a method of manufacturing the IC device 100 illustrated in FIGS. 1A to 1D is described as an example. FIGS. 10A to 10J schematically illustrate main elements in the regions of the IC device 100 taken along lines C-C' and D-D', according to the manufacturing process.

Figure 10A:
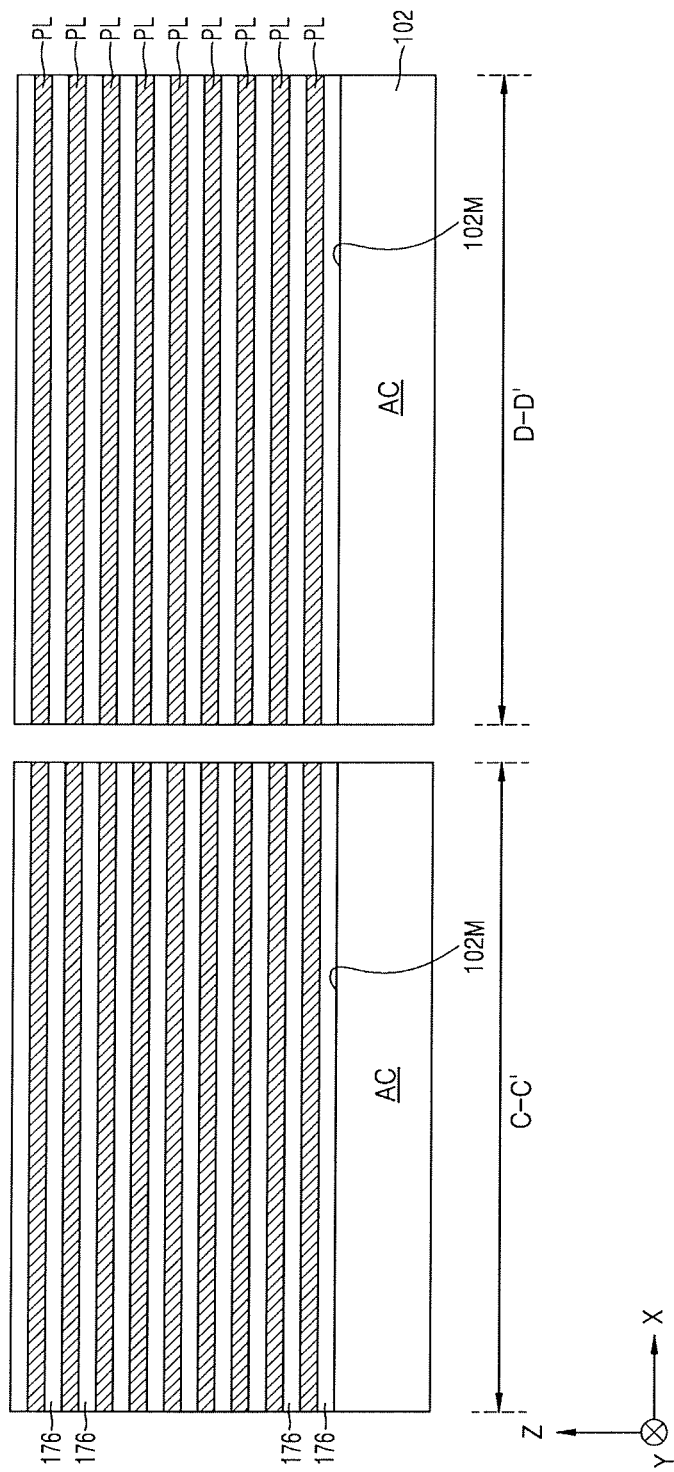
FIGS. 10A to 10J are cross-sectional views that sequentially illustrate a method of manufacturing an IC device, according to an exemplary embodiment of the inventive concept.

Referring to FIG. 10A, after forming a device isolation layer for defining an active region AC on a substrate 102, a plurality of insulating layers 176 and a plurality of preliminary gate layers PL are alternately stacked one by one on the substrate 102.

The plurality of insulating layers 176 may be formed of, for example, silicon oxide, silicon nitride, or silicon oxynitride. The plurality of preliminary gate layers PL, which includes a material different from that of the insulating layer 176, may be formed of, for example, silicon nitride, silicon carbide, or polysilicon. Each of the plurality of preliminary gate layers PL may be a preliminary layer or a sacrificial layer for forming at least one ground selection line GSL, a plurality of word lines WL1, WL2, . . . , WLn−1, WLn, and at least one string selection line SSL in subsequent processes.

Figure 10B:
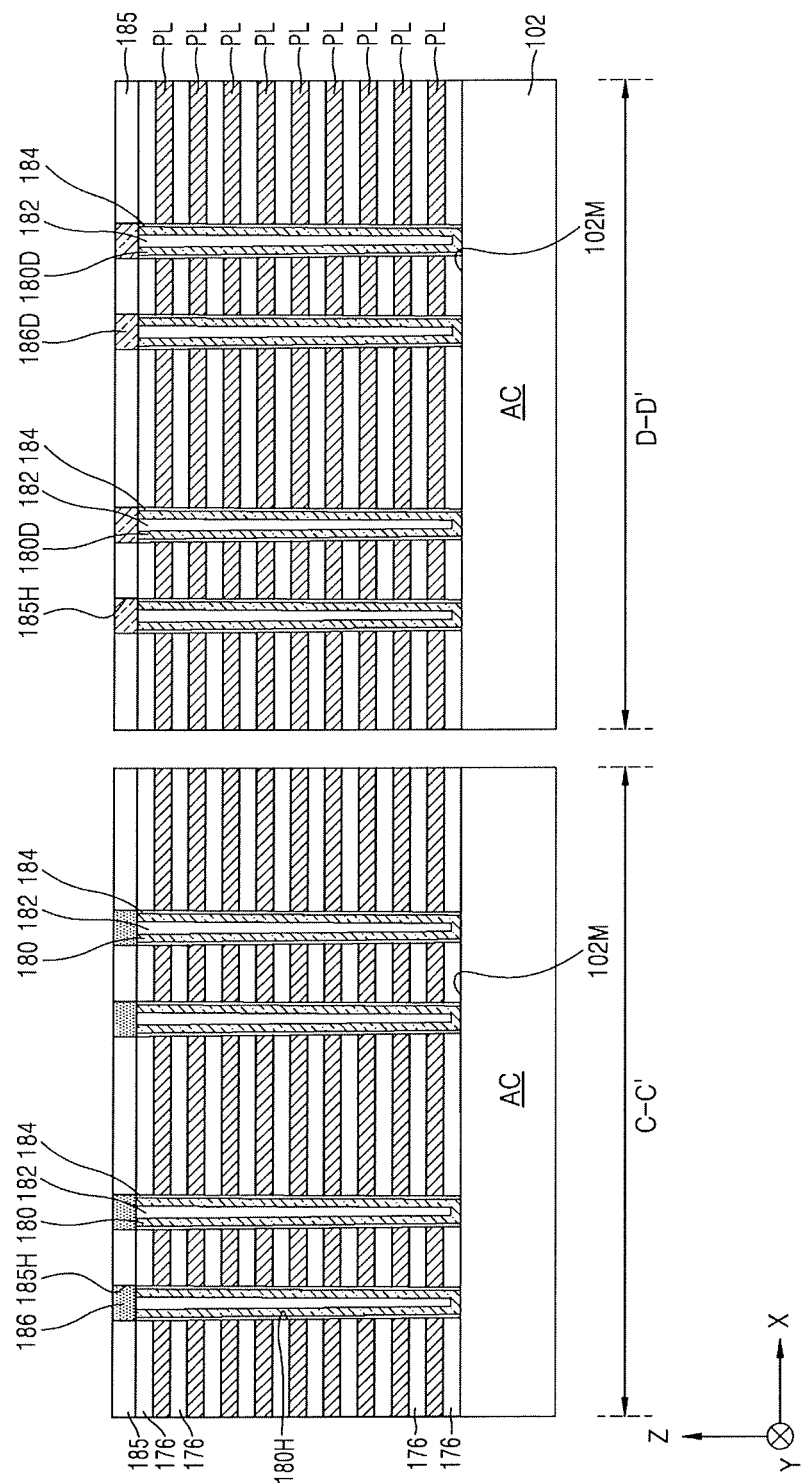

Referring to FIG. 10B, after forming a plurality of channel holes 180H that penetrate the plurality of insulating layers 176 and the plurality of preliminary gate layers PL and extend in a direction (the Z direction) which is perpendicular to an extending direction (the X direction) of the main surface 102M of the substrate 102, a gate dielectric layer 184, a channel region 180, a dummy channel region 180D, and a buried insulating layer 182 are formed in each of the plurality of channel holes 180H. In the process of forming the plurality of channel holes 180H, a first mask pattern may be formed on the top layer of the plurality of insulating layers 176, and then the plurality of insulating layers 176 and the plurality of preliminary gate layers PL may be anisotropically etched using the first mask pattern as an etching mask until the main surface 102M of the substrate 102 is exposed. The first mask pattern may be a photoresist pattern, and may be formed through a lithographic process.

The gate dielectric layer 184 may cover an inner sidewall of each of the plurality of channel holes 180H. The gate dielectric layer 184 may include a blocking insulating layer, a charge storage layer, and a tunnel insulating layer, sequentially formed on the sidewall of each of the plurality of channel holes 180H. In an exemplary embodiment of the inventive concept, the tunnel insulating layer, the charge storage layer, and the blocking insulating layer may be formed by, for example, an atomic layer deposition (ALD) process, a chemical vapor deposition (CVD) process, etc.

The channel region 180 and the dummy channel region 180D may contact regions of the substrate 102 exposed at the bottom of the channel holes 180H, and an outer surface of the channel region 180 may contact the gate dielectric layer 184. In an exemplary embodiment of the inventive concept, the channel region 180 and the dummy channel region 180D may be formed of impurity-doped polysilicon. The channel region 180 and the dummy channel region 180D may be formed by, for example, a chemical vapor deposition (CVD) process, a low pressure CVD (LPCVD) process, or an atomic layer deposition (ALD) process. However, the inventive concept is not limited thereto.

The buried insulating layer 182 may be formed by, for example, a CVD process, an LPCVD process, or an ALD process by using an insulating material, such as, for example, silicon oxide, silicon nitride, or silicon oxynitride. The buried insulating layer 182 may include an air gap.

After forming an insulating layer 185, which covers upper surfaces of the channel region 180, the dummy channel region 180D, the buried insulating layer 182, and the gate dielectric layer 184, and forming a plurality of contact holes 185H, which expose the upper surfaces of the channel region 180, the dummy channel region 180D, and the buried insulating layer 182, in the insulating layer 185, a plurality of bit line contact pads 186 and a plurality of dummy contact pads 186D are formed in the plurality of contact holes 185H.

In the process of forming the plurality of channel holes 185H, a second mask pattern, which may have a pattern the same as that of the first mask pattern, may be formed on the insulating layer 185, and then the insulating layer 185 may be anisotropically etched using the second mask pattern as an etching mask until the upper surfaces of the plurality of channel regions 180 and the plurality of dummy channel regions 180D are exposed.

The insulating layer 185 may be formed of, for example, silicon nitride, silicon oxide, or silicon oxynitride. The plurality of bit line contact pads 186 and the plurality of dummy contact pads 186D may be formed of, for example, impurity-doped polysilicon, metal, conductive metal nitride, or a combination thereof. Examples of the metal for forming the plurality of bit line contact pads 186 are tungsten, nickel, cobalt, titanium, tantalum, and the like. However, the inventive concept is not limited thereto.

Figure 10C:
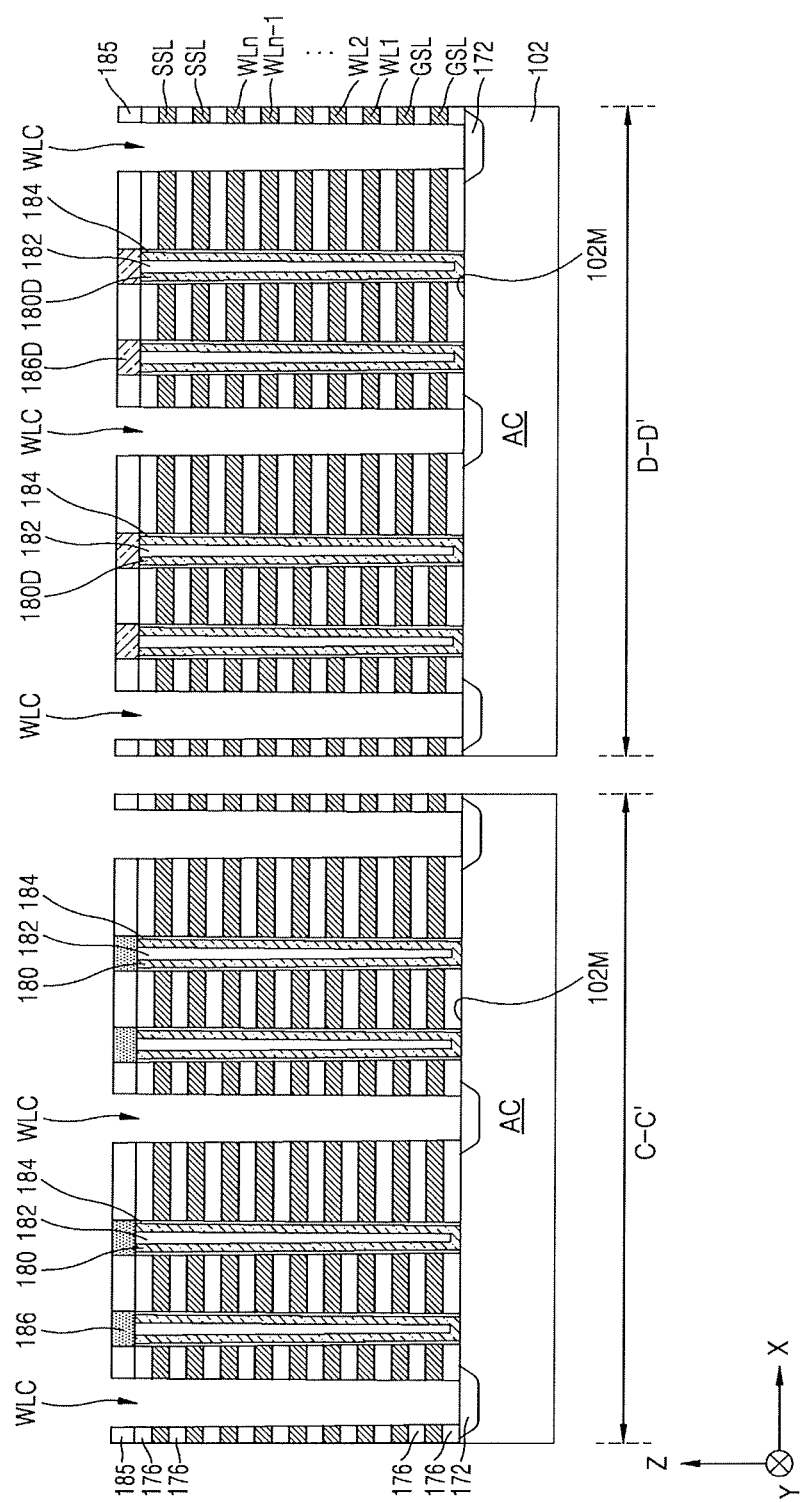

Referring to FIG. 10C, a plurality of word line cut regions WLC that penetrate the plurality of insulating layers 176 and the plurality of preliminary gate layers PL (see FIG. 10B) and expose the substrate 102 are formed. In the process of forming the plurality of word line cut regions WLC, a third mask pattern may be formed on the insulating layer 185, the plurality of bit line contact pads 186 and the plurality of dummy contact pads 186D, and then the insulating layer 185, the plurality of insulating layers 176 and the plurality of preliminary gate layers PL may be anisotropically etched using the third mask pattern as an etching mask until the main surface 102M of the substrate 102 is exposed.

A plurality of common source regions 172 are formed by implanting impurity ions into the substrate 102 through the plurality of word line cut regions WLC, and the plurality of preliminary gate layers PL (see FIG. 10C) are substituted with a plurality of ground select lines GSL, a plurality of word lines WL1, WL2, . . . , WLn−1, WLn, and a plurality of string select lines SSL.

When the plurality of preliminary gate layers PL are formed of polysilicon, a silicidation process may be performed on the plurality of preliminary gate layers PL to substitute the plurality of preliminary gate layers PL with the plurality of ground select lines GSL, the plurality of word lines WL1, WL2, . . . , WLn−1, WLn, and the plurality of string select lines SSL. In this case, the plurality of ground select lines GSL, the plurality of word lines WL1, WL2, WLn−1, WLn, and the plurality of string select lines SSL may each be formed of, for example, tungsten silicide, tantalum silicide, cobalt silicide, or nickel silicide.

In an exemplary embodiment of the inventive concept, after selectively removing the plurality of preliminary gate layers PL (see FIGS. 10B and 10C) that are exposed through the plurality of word line cut regions WLC, to form a plurality of empty spaces, the plurality of ground selection lines GSL, the plurality of word lines WL1, WL2, . . . , WLn−1, WLn, and the plurality of string select lines SSL may be formed by burying a conductive material in the plurality of empty spaces that are formed between the plurality of insulating layers 176. The plurality of preliminary gate layers PL may be selectively removed by a wet etching process. In this case, the plurality of ground select lines GSL, the plurality of word lines WL1, WL2, . . . , WLn−1, WLn, and the plurality of string select lines SSL may be formed by using a metal material, such as, for example, tungsten, tantalum, cobalt, or nickel. However, the inventive concept is not limited thereto.

Figure 10D:
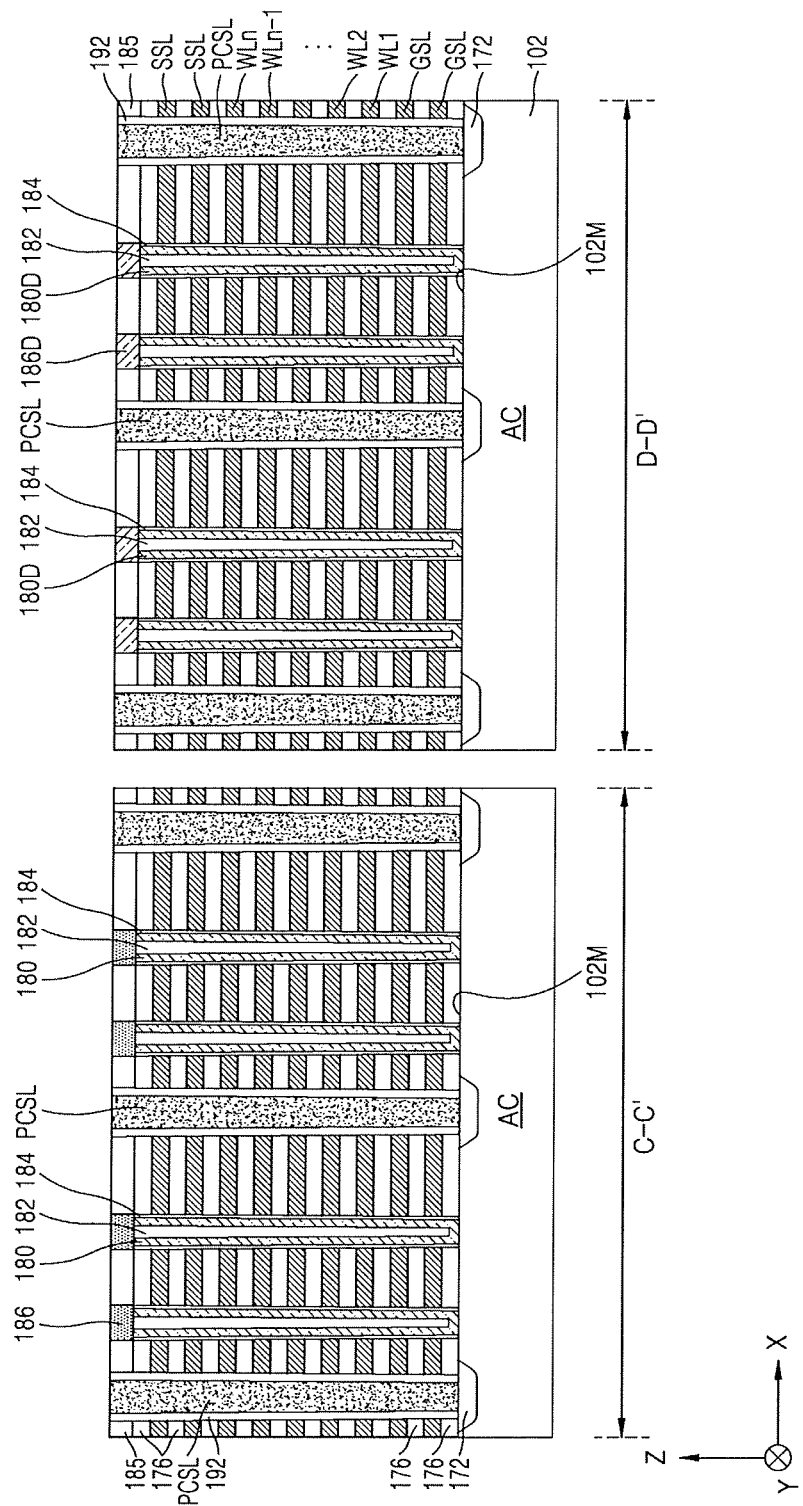

Referring to FIG. 10D, an insulating spacer 192 and a preliminary common source line PCSL may be formed in each of the plurality of word line cut regions WLC.

The insulating spacer 192 may be formed of, for example, silicon oxide, silicon nitride, silicon oxynitride, or a low-dielectric material. For example, the insulating spacer 192 may be formed of $SiO_2$, $Si_3N_4$, SiON, SiCOH, SiOCN, SiCN, or a combination thereof.

The preliminary common source lines PCSL may be formed of a conductive material. For example, the preliminary common source lines PCSL may be formed of a metal, such as tungsten, copper, aluminum, or the like; a conductive metal nitride such as titanium nitride, tantalum nitride, or the like; a transition metal, such as titanium, tantalum, or the like; or a combination thereof.

In an exemplary embodiment of the inventive concept, a metal silicide layer for lowering contact resistance may be interposed between the common source region 172 and the preliminary common source line PCSL. For example, the metal silicide layer may be formed of cobalt silicide, tungsten silicide, nickel silicide, or the like. However, the inventive concept is not limited thereto.

In an exemplary embodiment of the inventive concept, to form the insulating spacer 192 in each of the plurality of word line cut regions WLC, after an insulating layer covering the inner sidewall of the plurality of word line cut regions WLC is formed, the insulating layer may be etched back to expose the substrate 102 at the bottom of the plurality of word line cut regions WLC, thereby forming the insulating spacer 192 as a part of the insulating layer remaining on the inner sidewall of each of the plurality of word line cut regions WLC.

To form the preliminary common source lines PCSL, after a conductive material is deposited on the inner sides of the plurality of word line cut regions WLC and on the insulating layer 185 to fill the space defined by the insulating spacer 192 in the plurality of word line cut regions WLC, the conductive material on an outside of the plurality of word line cut regions WLC may be removed by CMP or etching back to expose the upper surface of the insulating layer 185, thereby to leave the conductive material only inside the plurality of word line cut regions WLC.

Figure 10E:
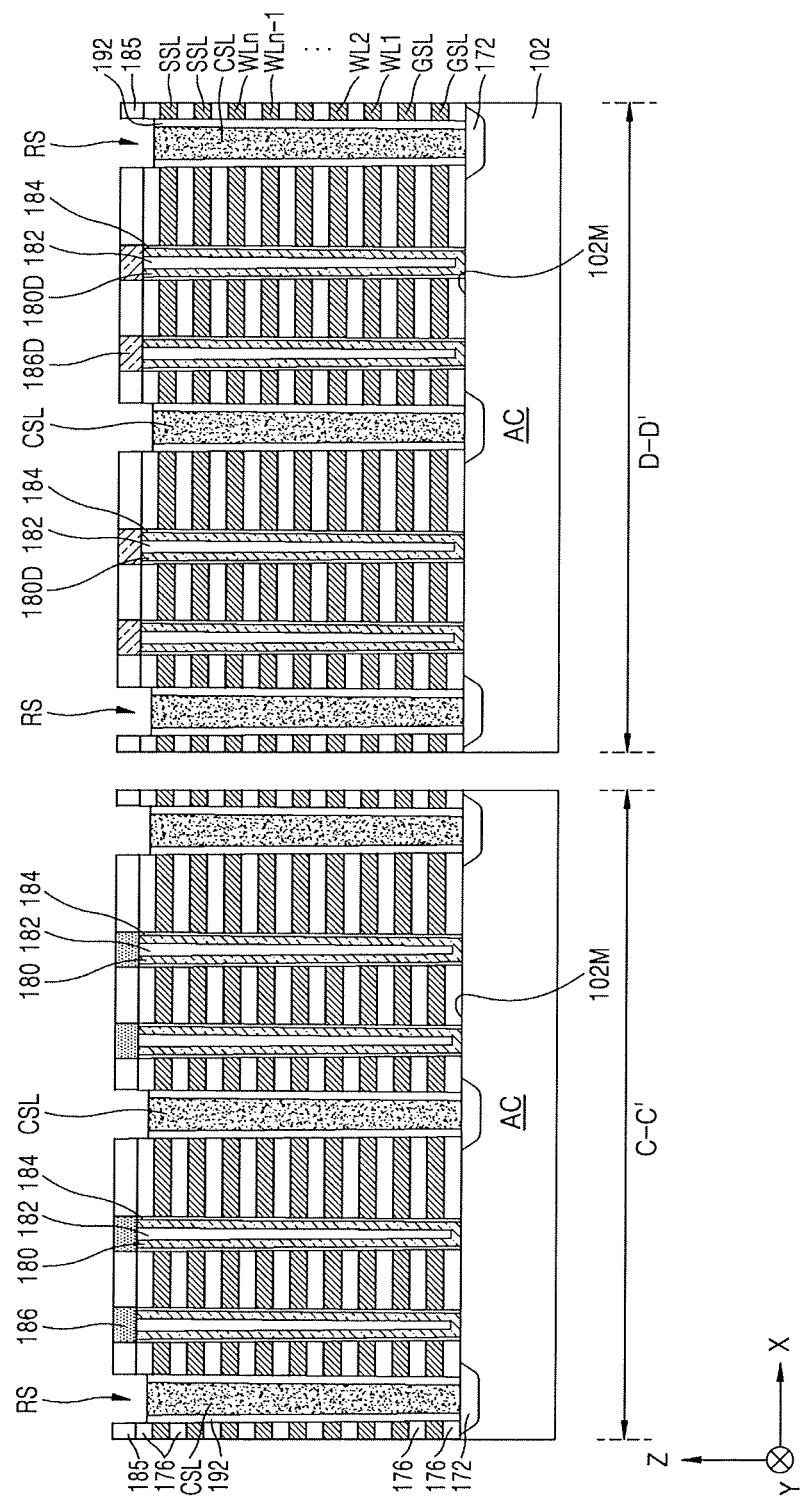

Referring to FIG. 10E, the preliminary common source lines PCSL may be partially removed by an etching process from the plurality of word line cut regions WLC to form a plurality of recess spaces RS in upper portions of the plurality of word line cut regions WLC, so that a plurality of common source lines CSL partially fill the plurality of word line cut regions WLC only to a certain height level in the word line cut regions.

The upper surfaces of the plurality of common source lines CSL may be exposed through the plurality of recess spaces RS in the plurality of word line cut regions WLC.

In an exemplary embodiment of the inventive concept, the preliminary common source lines PCSL may be formed of a metal. In this case, by partial removal of the preliminary common source lines PCSL from the inside of the plurality of word line cut regions WLC, the volume of metal in the plurality of word line cut regions WLC may be removed as much as the amount of the preliminary common source lines PCSL removed. This may reduce physical stress on the IC device caused by metal, so that deformation of the IC device, caused by physical stress, and consequential occurrence of unwanted defects may be prevented.

In an exemplary embodiment of the inventive concept, the preliminary common source lines PCSL may be formed of tungsten (W). In this case, a byproduct gas such as hydrogen fluoride (HF) may be generated during the process of forming the preliminary common source lines PCSL. The byproduct gases may remain in the plurality of word line cut regions WLC after the formation of the preliminary common source lines PCSL. When a fluorine (F)-containing gas remains in the plurality of word line cut regions WLC, the F-containing gas may be locally concentrated in the plurality of word line cut regions WLC thus to damage the preliminary common source lines PCSL consisting of W and/or the gate dielectric layer 184, so that a defect such as electrical short between the common source lines CSL and the word lines WL may occur.

In the method of manufacturing an IC device, according to an exemplary embodiment of the inventive concept, byproduct gases remaining in the plurality of word line cut regions WLC may be discharged out of the plurality of recess spaces RS through the plurality of recess spaces RS. In an exemplary embodiment of the inventive concept, to discharge byproduct gases such as hydrogen fluoride (HF) remaining in the plurality of word line cut regions WLC, a thermal treatment process or a vacuum pumping process may be used. The heat treatment process may be performed at a temperature higher than room temperature, for example, at about 600° C., under nitrogen atmosphere. In an exemplary embodiment of the inventive concept, the thermal treatment process may be performed in-situ with the process of forming the preliminary common source lines PCSL.

In an exemplary embodiment of the inventive concept, during the partial removal of the preliminary common source lines PCSL from the plurality of word line cut regions WLC, the insulating spacers 192 exposed in the upper portions of the plurality of word line cut regions WLC may also be removed at the same time, thus to expose the sidewall of the insulating layer 185 in upper regions of the plurality of recess spaces RS, as illustrated in FIG. 10E.

In an exemplary embodiment of the inventive concept, during the partial removal of the preliminary common source lines PCSL from the inside of the plurality of word line cut regions WLC, at least part of the insulating spacer 192 exposed in the upper portions of the plurality of word line cut regions WLC may remain, covering the sidewall of the plurality of word line cut regions WLC.

Figure 10F:
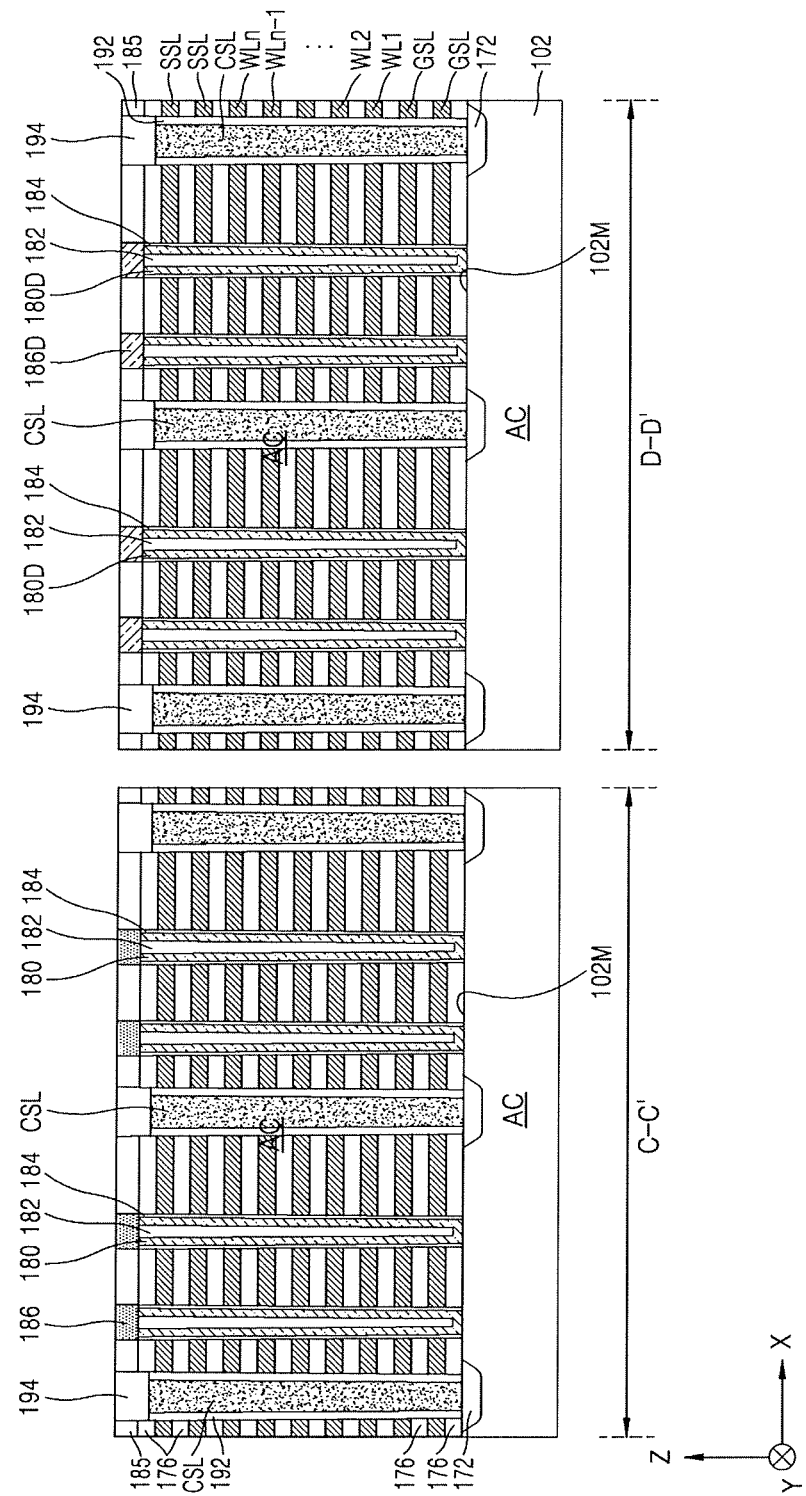

Referring to FIG. 10F, a plurality of word line cut region buried insulating layers 194 filling the plurality of recess spaces RS (see FIG. 10E) may be formed.

The plurality of word line cut region buried insulating layers 194 may be formed to have any of the structures of the word line cut region buried insulating layers 194 illustrated in FIGS. 4A to 4C.

In an exemplary embodiment of the inventive concept, to form the word line cut region buried insulating layers 194 having a single layer structure as illustrated in FIG. 4A, after an insulating material is deposited on the substrate 102 to fill the plurality of recess spaces RS, the deposited insulating layer may be partially removed by CMP or etching back to remain only within the plurality of recess spaces RS, exposing the upper surface of the insulating layer 185.

The insulating material may be, for example, $SiO_2$, $Si_3N_4$, SiON, SiCOH, SiOCN, or SiCN.

In an exemplary embodiment of the inventive concept, to form the word line cut region buried insulating layers 194 as a double layer, including the first insulating layer 194A and the second insulating layer 194B formed of different materials, as illustrated in FIG. 4B, after a preliminary insulating layer for forming the first insulating layer 194A is formed in the plurality of recess spaces RS, the preliminary insulating layer may be partially etched back to leave only a portion of the preliminary insulating layer covering the inner sidewall of the plurality of recess spaces RS as the first insulating layer 194A. Next, the other region of the plurality of recess spaces RS may be filled with the second insulating layer 194B.

The preliminary insulating layer may be formed of, for example, $SiO_2$, $Si_3N_4$, SiON, SiCOH, SiOCN, or SiCN.

In an exemplary embodiment of the inventive concept, to form the word line cut region buried insulating layer 194 as a double layer, including the third insulating layer 194C and the fourth insulating layer 194D formed of different materials, as illustrated in FIG. 4C, after an insulating liner conformally covering the inner wall of the plurality of recess spaces RS is formed, a buried insulating layer may be formed on the insulating layer to fill the other region of the plurality of recess spaces RS. Next, the unnecessary portions of the insulating liner and the buried insulating layer remaining outside the plurality of recess spaces RS may be removed to leave the insulating liner and the buried insulating layer only within the plurality of recess spaces RS. The insulating liner and the buried insulating layer remaining within the plurality of recess spaces RS may form the third insulating layer 194C and the fourth insulating layer 194D, respectively.

The insulating liner and the buried insulating layer may be formed of different materials selected from $SiO_2$, $Si_3N_4$, SiON, SiCOH, SiOCN, and SiCN.

Figure 10G:
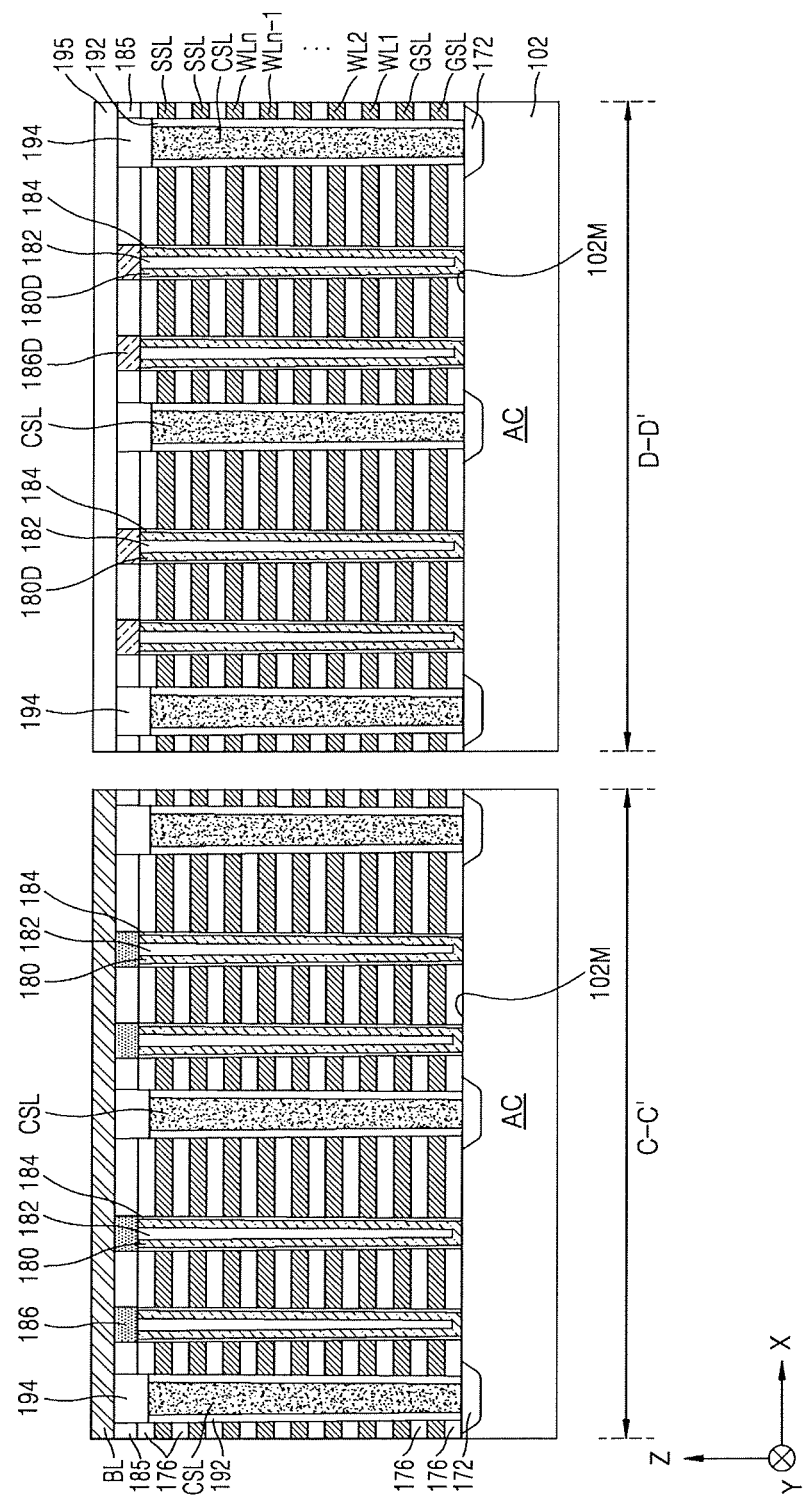

Referring to FIG. 10G, a plurality of bit lines BL connected to some channel regions selected from the plurality of channel regions 180 may be formed.

The plurality of bit lines BL may not be formed on the plurality of dummy channel regions 180D.

To form the plurality of bit lines BL, after a first upper insulating layer 195 which covers the plurality of bit line contact pads 186, the plurality of dummy contact pads 186D, the plurality of word line cut region buried insulating layer 194, and the insulating layer 185 are formed on the substrate 102, the first upper insulating layer 195 may be partially removed to have a plurality of linear openings that expose the plurality of channel regions 180. Next, a plurality of bit lines BL that fill the plurality of linear openings may be formed using a damascene process. The plurality of bit lines BL may directly contact some channel regions 180 selected from the plurality of channel regions 180. In the damascene process, the pattern of the plurality of bit lines BL is first lithographically defined, for example using a fourth mask pattern to form the plurality of linear openings, in the first upper insulating layer 195, then metal is deposited to fill the resulting linear openings and then excess metal is removed by means of CMP.

In an exemplary embodiment of the inventive concept, the first upper insulating layer 195 may be formed of, for example, a silicon oxide layer, a silicon nitride layer, a silicon oxynitride layer, or a combination thereof.

Figure 10H:
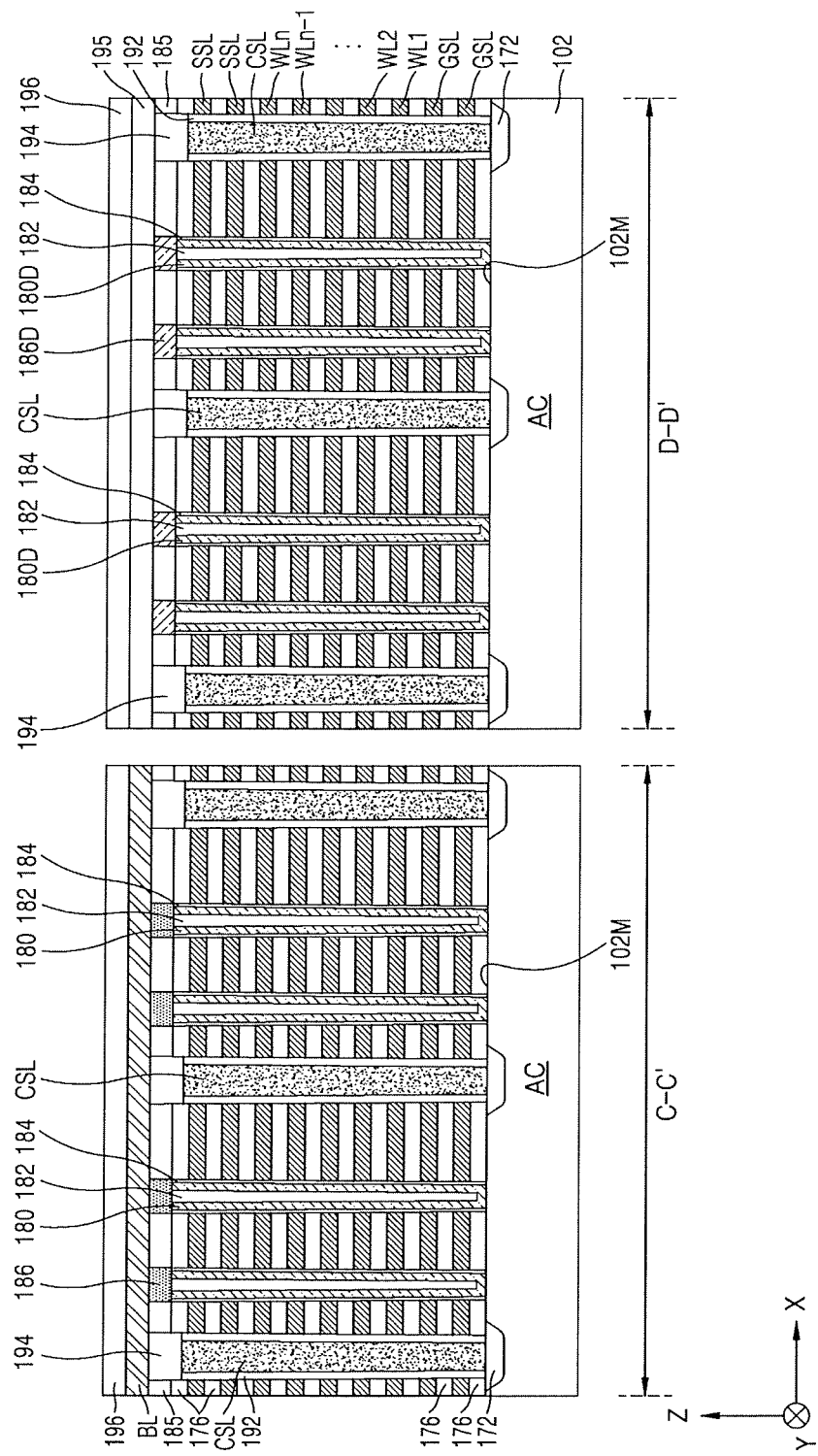

Referring to FIG. 10H, a second upper insulating layer 196 that covers the plurality of bit lines BL and the first upper insulating layer 195 may be formed on the substrate 102.

In an exemplary embodiment of the inventive concept, the second upper insulating layer 196 may be formed of, for example, a silicon oxide layer, a silicon nitride layer, a silicon oxynitride layer, or a combination thereof.

Figure 10I:
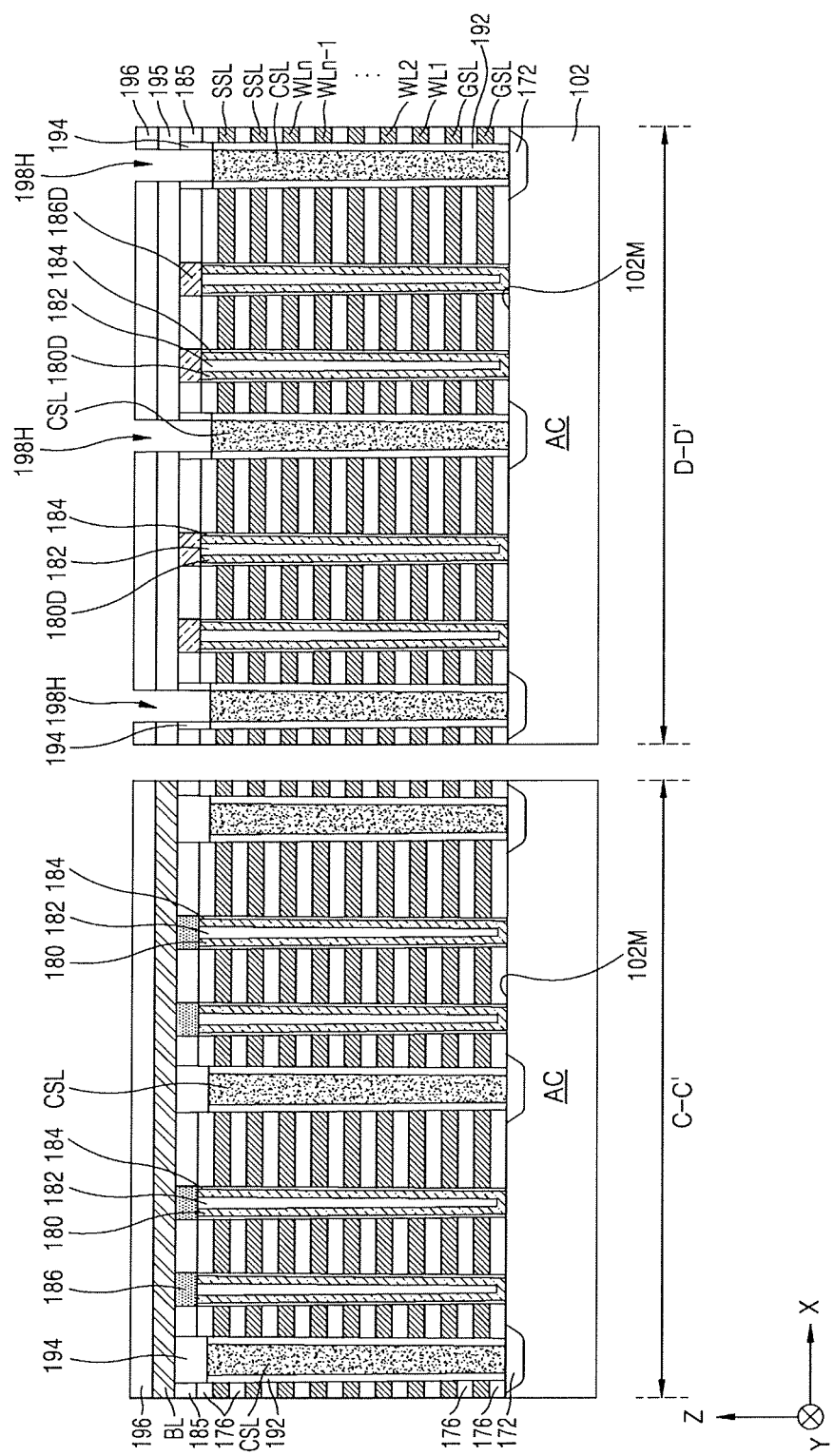

Referring to FIG. 10I, in the common source line tab region CSL TAB, the second upper insulating layer 196, the first upper insulating layer 195, and the plurality of word line cut region buried insulating layers 194 may be partially removed to form a plurality of via contact holes 198H that expose the plurality of common source lines CSL.

The plurality of via contact holes 198H may be formed in a region that does not overlap with the plurality of bit lines BL.

Figure 10J:
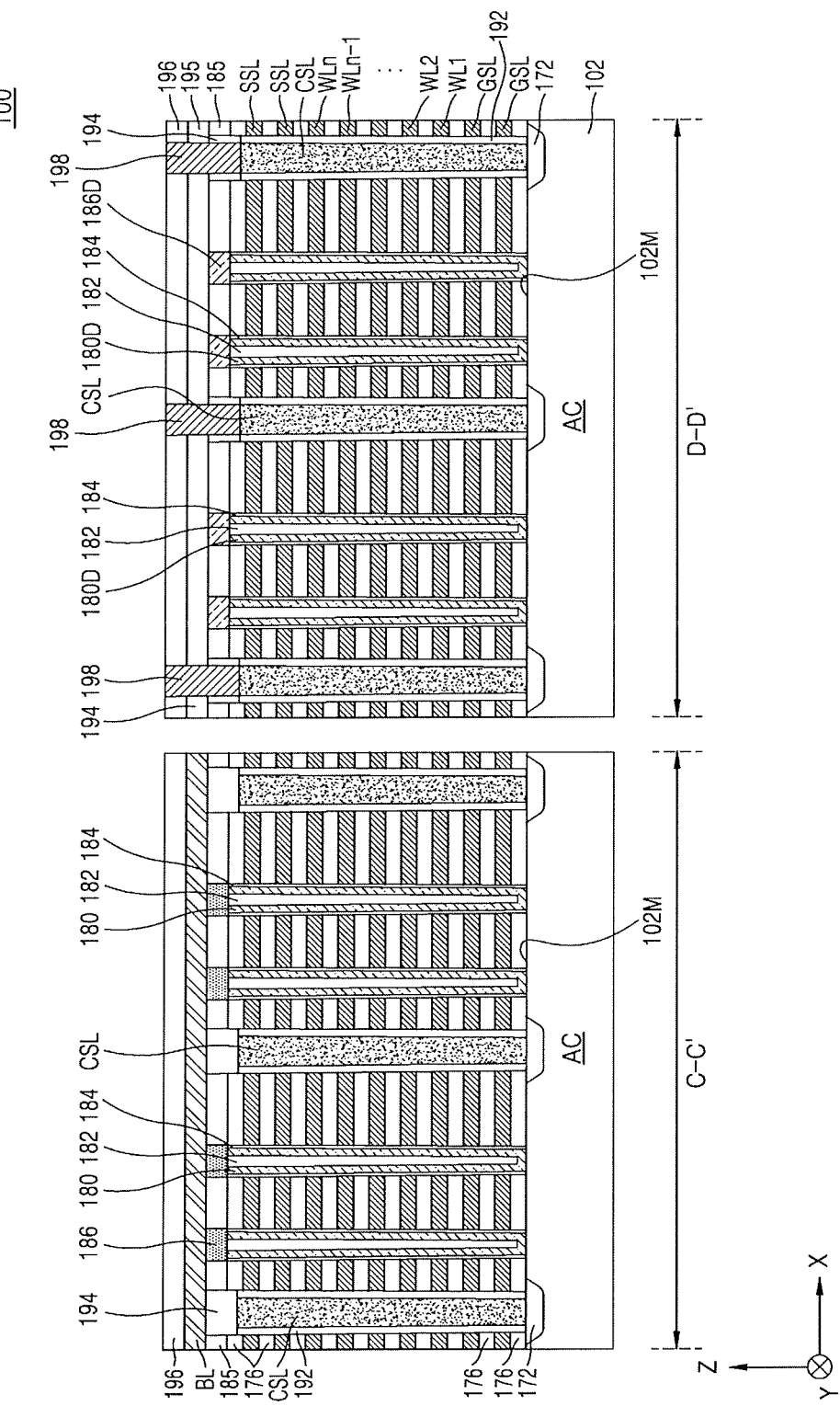

Referring to FIG. 10J, in the common source line tab region CSL TAB, a plurality of common source via contacts 198 that fill the plurality of via contact holes 198H may be formed.

The plurality of common source via contacts 198 may be formed using a damascene process. In the damascene process, the pattern of the plurality of common source via contacts 198 is first lithographically defined, for example using a fifth mask pattern, to form the plurality of contact holes 198H through the second upper insulating layer 196, the first upper insulating layer 195, and the plurality of word line cut region buried insulating layers 194, then metal is deposited to fill the plurality of contact holes 198H and then excess metal is removed by means of CMP. The plurality of common source via contacts 198 may be formed of, for example, metal, metal silicide, semiconductor doped with impurities, or a combination thereof. For example, the plurality of common source via contacts 198 may include a metal, such as tungsten, nickel, cobalt, titanium, tantalum, or the like; a metal silicide, such as tungsten silicide, nickel silicide, cobalt silicide, titanium silicide, tantalum silicide, or the like; polysilicon doped with impurities; or a combination thereof. However, the inventive concept is not limited thereto.

The method of manufacturing the IC device 100 is described above with reference to FIGS. 10A to 10J, but IC devices having structures other than modifications or changes described above in the manufacturing processes with reference to FIGS. 10A to 10J may also be manufactured within the scope of the inventive concept. For example, to manufacture the IC device 200 illustrated as an exemplary embodiment in FIGS. 5A and 5B, when partially removing the preliminary common source lines PCSL (see FIG. 10D) from the inside of the plurality of word line cut regions WLC in the process of forming the plurality of common source lines CSL described with reference to FIG. 10E, a plurality of deep recess spaces having a deeper depth than the plurality of recess spaces RS illustrated in FIG. 10E may be formed by increasing the amount of the preliminary common source lines PCSL being removed.

The word line cut region buried insulating layer 294 (see FIGS. 5A and 5B) that fills the plurality of deep recess spaces may be formed in a similar manner as described with reference to FIG. 10F, and a plurality of common source via contacts 298 (see FIG. 5B) that are connected to the plurality of common source lines CSL through the word line cut region buried insulating layer 294 may be formed by performing the processes described with reference to FIGS. 10G to 10J.

In the manufacturing of the IC device 200 illustrated in FIGS. 5A and 5B, by increasing the amount of the preliminary common source lines PCSL being removed to form a plurality of deep recess spaces having a comparative deep depth in the plurality of word line cut regions WLC, the volume of the metal layer in the plurality of word line cut regions WLC may be further reduced, and consequentially physical stress caused from the metal in the IC device 200 may also be further reduced. Accordingly, deformation of the IC device, caused by physical stress, and consequential occurrence of unwanted defects may be prevented.

In the case where the preliminary common source lines PCSL are formed of tungsten (W), by increasing the amount of the preliminary common source lines PCSL being removed to form a plurality of deep recess spaces having a comparative deep depth in the plurality of word line cut regions WLC, the process of removing F-containing byproduct gases as described above with reference to FIG. 10E may be more easily and efficiently performed. Accordingly, the damage of peripheral constituent elements caused by the F-containing gas that is locally concentrated in the plurality of word line cut regions, or defects such as electrical short between the common source lines CSL and the word lines WL may be further effectively prevented.

To manufacture the IC device 300 illustrated as an exemplary embodiment in FIGS. 6A and 6B, after forming a plurality of common source via contacts 198 by performing the processes described with reference to FIGS. 10A to 10J, the upper wiring layers 310 and 320 that are connected to the common source via contacts 198 may be formed on the plurality of common source via contacts 198 and the second upper insulating layers 196.

In an exemplary embodiment of the inventive concept, to manufacture the IC device 500 illustrated in FIGS. 8A to 8C, the following processes may be performed. First, the first peripheral circuit region 414 may be formed in a region on the substrate 401. As an exemplary method of forming the first peripheral circuit region 414, first, a trench 402T may be formed in the substrate 402. The trench 402T may then be buried with an insulating material such as silicon oxide to form a device isolation layer 104 that defines the active region AC. Next, a plurality of ion implantation processes may be performed on the substrate 402 to form a p-well and a n-well for a peripheral circuit. The p-well for the peripheral circuit may be a region for forming an NMOS transistor, and the n-well for the peripheral circuit may be a region for forming a PMOS transistor.

A gate dielectric layer GD for the peripheral circuit may be formed on the substrate 402. Next, a gate G for the peripheral circuit may be formed on the gate dielectric layer GD. The gate G may be formed of, for example, doped polysilicon, metal, or a combination thereof. The insulating spacer 106 may be formed on a sidewall of the gate G, and a source/drain region SD may be formed on both sides of the gate G in the substrate 402. The source/drain region SD for forming an NMOS transistor may be formed by implanting n-type impurities in the substrate 402. The source/drain region SD for forming a PMOS transistor may be formed by implanting p-type impurities in the substrate 402. The source/drain region SD may have a lightly doped drain (LDD) structure. Accordingly, a plurality of transistors each including the gate dielectric layer GD, the gate G, and the source/drain region SD may be formed.

The etch stop layer 108 may be formed on the plurality of transistors TR and the insulating spacer 106. The etch stop layer 108 may include an insulating material selected from, for example, silicon nitride, silicon oxynitride, and a combination thereof.

The multilayer wiring structure 114, which includes the first contact 116A, the first wiring layer 118A, the second contact 116B, the second wiring layer 118B, the third contact 116C, and the third wiring layer 118C, and a plurality of interlayer insulating layers 112A, 112B, 112C, and 112D that insulate the layers in the multilayer wiring structure 114 from one another may be formed on the etch stop layer 108. In an exemplary embodiment of the inventive concept, the third wiring layer 118C of the multilayer wiring structure 114 may be an uppermost wiring layer.

While the first peripheral circuit region 414 is formed in a region of the substrate 402, at least part of the second peripheral circuit region 416 described with reference to FIG. 7 may also be formed in another region on the substrate 402.

The semiconductor layer 420 may be formed on the interlayer insulating layer 112D that covers the third wiring layer 118C as the upper most wiring layer of the multilayer wiring structure 114.

Similar processes as described above with reference to FIGS. 10A to 10J may be performed to thereby form the IC device 500 illustrated as an exemplary embodiment in FIGS. 8A to 8C.

To manufacture the IC device 600 illustrated as an exemplary embodiment in FIGS. 9A and 9B, after performing the processes of forming the gate dielectric layer 184, the channel region 180, the dummy channel region 180D, and the buried insulating layer 182 in each of the plurality of channel holes 180H (referring to FIG. 10B), before forming the insulating layer 185 that covers the upper surfaces of these formed layers or regions, in the state where the upper portions of the plurality of channel regions 180 and the upper portions of the plurality of dummy channel regions 180D are exposed, a sixth mask pattern that exposes some channel regions 180 selected from the plurality of channel regions 180 and some dummy channel regions 180D selected from the plurality of dummy channel regions 180D may be formed, and a process of selectively implanting a desired type of impurity ions into the some channel regions 180 and the some dummy channel regions 180D that are exposed through the sixth mask pattern used as an ion implantation mask may be performed. This ion implantation process may be performed once or multiple times depending on need, to thereby form the plurality of doped channel regions 682 in the plurality of channel regions 680, and the plurality of dummy doped channel regions 682D in the plurality of dummy channel regions 680D (referring to FIGS. 9A and 9B).

In the methods of manufacturing an IC device, according to the above-described embodiments of the inventive concept, the number of wiring layers that may be formed on the plurality of bit lines BL may be reduced. In particular, only one wiring layer may be formed on the plurality of bit lines BL, so that the manufacturing process of a vertical memory device may be simplified.

Exemplary methods of manufacturing IC devices according to the embodiments of the inventive concept are described above. However, it will be understood by those of ordinary skill in the art that IC devices having structures other than the modifications or changes of the IC devices 100, 200, 300, 400, 500, and 600 illustrated as examples in FIGS. 1A to 9B may be manufactured within the scope of the inventive concept.

Figure 11:
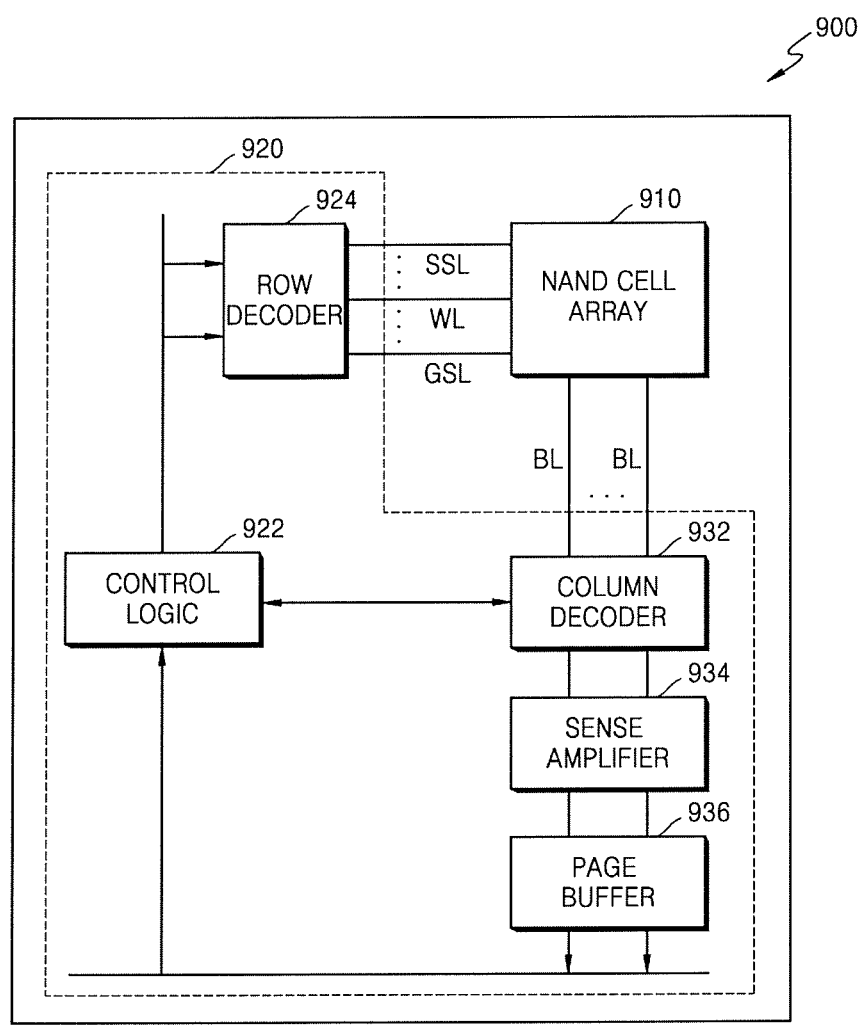
FIG. 11 is a schematic block diagram of a nonvolatile memory device using an IC device according to an exemplary embodiment of the inventive concept.

FIG. 11 is a schematic block diagram of a nonvolatile memory device 900 using an IC device according to an exemplary embodiment of the inventive concept.

Referring to FIG. 11, a NAND cell array 910 of the nonvolatile memory device 900 may be combined with a core circuit unit 920. For example, the NAND cell array 910 may include at least one of the IC devices 100, 200, 300, 400, 500, and 600 described above with reference to FIGS. 1A to 9B. The core circuit unit 920 may include a control logic 922, a row decoder 924, a column decoder 932, a sense amplifier 934, and a page buffer 936.

The control logic 922 may communicate with the row decoder 924, the column decoder 932, and the page buffer 936. The row decoder 924 may communicate with the NAND cell array 910 through a plurality of string selection lines SSL, a plurality of word lines WL, and a plurality of ground selection lines GSL. The column decoder 932 may communicate with the NAND cell array 910 through a plurality of bit lines BL. The sense amplifier 934 may be connected to the column decoder 932 when a signal is output from the NAND cell array 910 and may not be connected to the column decoder 932 when a signal is transmitted to the NAND cell array 910.

The control logic 922 may transmit row address signals to the row decoder 924, and the row decoder 924 may decode the row address signals and transmit decoded row address signals to the NAND cell array 910 through the plurality of string selection lines SSL, the plurality of word lines WL, and the plurality of ground selection lines GSL. The control logic 922 may transmit column address signals to the column decoder 932 or the page buffer 936, and the column decoder 932 may decode the column address signals and transmit decoded column address signals to the NAND cell array 910 through the plurality of bit lines BL. Output signals of the NAND cell array 910 may be transmitted to the sense amplifier 934 via the column decoder 932 and amplified by the sense amplifier 934, and the amplified output signals may be transmitted to the control logic 922 via the page buffer 936.

Figure 12:
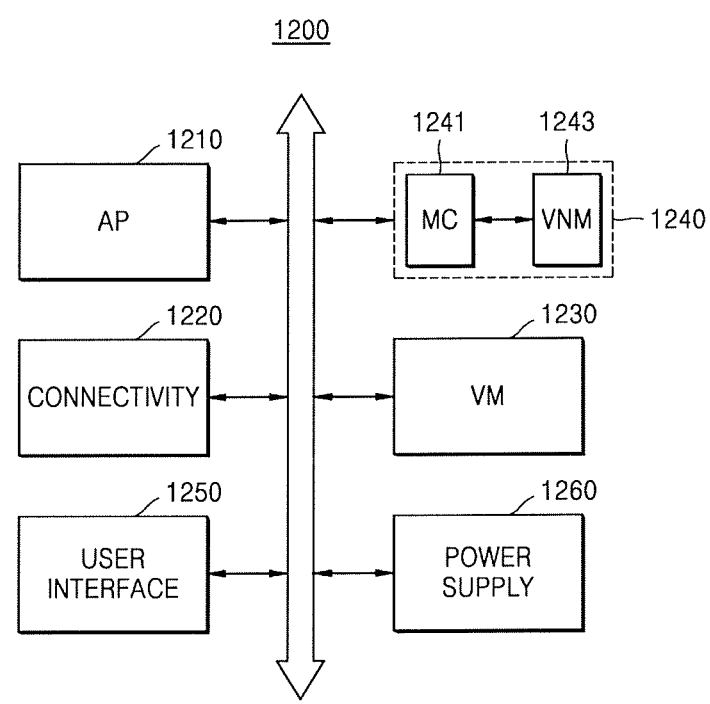
FIG. 12 is a block diagram of a mobile system using an IC device according to an exemplary embodiment of the inventive concept.

FIG. 12 is a block diagram of a mobile system 1200 using an IC device according to an exemplary embodiment of the inventive concept.

Referring to FIG. 12, the mobile system 1200 may include an application processor 1210, a connectivity unit 1220, a volatile memory device 1230, a nonvolatile memory system 1240, a user interface 1250, and a power supply 1260.

The mobile system 1200 may be any mobile system, such as, for example, a mobile phone, a smart phone, a personal digital assistant (PDA), a portable multimedia player (PMP), a digital camera, a music player, a portable game console, or a navigation system.

The application processor 1210 may perform applications providing, for example, internet browsers, games, or videos. In an exemplary embodiment of the inventive concept, the application processor 1210 may include a single core or a multi-core. For example, the application processor core 1210 may include a multi-core, such as a dual-core, a quad-core, or a hexa-core. Also, the application processor 1210 may further include a cache memory located in the inside or outside thereof.

The connectivity unit 1220 may communicate with an external device by wire or wireless. For example, the connectivity unit 1220 may perform Ethernet communication, near field communication (NFC), radio frequency identification (RFID) communication, mobile telecommunication, memory card communication, or universal serial bus (USB) communication. For example, the connectivity unit 1220 may include a baseband chipset and may support communication such as GSM, GPRS, WCDMA, HSxPA, and the like.

The volatile memory device 1230 may store data that are processed by the application processor 1210 or may operate as a working memory. For example, the volatile memory device 1230 may be implemented with dynamic random access memory (DRAM), static random access memory (SRAM), mobile DRAM, double data rate (DDR) synchronous DRAM (DDR SDRAM), low power DDR (LPDDR) SDRAM, graphic DDR (GDDR) SDRAM, Rambus DRAM (RDRAM), or a memory that is similar thereto.

The nonvolatile memory system 1240 may include a memory controller 1241 and a nonvolatile memory device 1243 and may store a boot image for booting the mobile system 1200. For example, the nonvolatile memory device 1243 may be implemented with electrically erasable programmable read-only memory (EEPROM), a flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or a memory that is similar thereto. The nonvolatile memory device 1243 may include any one of the IC devices 100, 200, 300, 400, 500, and 600 described above with reference to FIGS. 1A to 9B.

The user interface 1250 may include one or more input devices, such as, for example, a keypad or a touch screen, and/or one or more output devices, such as, for example, a speaker or a display device.

The power supply may supply an operating voltage of the mobile system 1200. The mobile system 1200 may further include a camera image processor (CIS) and a storage device, such as, for example, a memory card, a solid state drive (SSD), a hard disk drive (HDD), or a CD-ROM.

The mobile system 1200 may be mounted by using packages of various types. For example, the mobile system 1200 may be mounted by using packages, such as package on package (PoP), ball grid array (BGA), chip scale package (CSP), plastic leaded chip carrier (PLCC), plastic dual in-line package (PDIP), die in waffle pack (DWP), die in wafer form (DWF), chip on board (COB), ceramic dual in-line package (CERDIP), plastic metric quad flat pack (MQFP), thin quad flat-pack (TQFP), small outline IC (SOIC), shrink small outline package (SSOP), thin small outline package (TSOP), thin quad flat-pack (TQFP), system in package (SIP), multi chip package (MCP), wafer-level fabricated package (WFP), and wafer-level processed stack package (WSP).

While the inventive concept has been particularly shown and described with reference to specific embodiments of the inventive concept thereof, it will be understood that various changes in form and details may be made therein without departing from the spirit and scope of the following claims.

What is claimed is:
1. An integrated circuit (IC) device comprising:
a plurality of word lines that extend on a substrate parallel to a main surface of the substrate and are separated from one another in a first direction perpendicular to the main surface;
a channel region that extends in a first region on the substrate through the plurality of word lines;
a bit line contact pad that is on the channel region and contacts an upper surface of the channel region;
a bit line that contacts the bit line contact pad in the first region and extends on the bit line contact pad in a second direction parallel to the main surface of the substrate;
a common source line that partially fills a word line cut region in the first region and a second region separated from the first region, with a word line cut region buried insulating layer interposed between the common source line and the bit line in the first region, the word line cut region extending in a third direction on a side of the plurality of word lines, the third direction being parallel to the main surface of the substrate and intersecting the second direction, the common source line having a height from the substrate lower than that of the channel region; and
a common source via contact that contacts an upper surface of the common source line in the word line cut region in the second region and extends from the upper surface of the common source line in a direction away from the substrate.

2. The IC device of claim 1, wherein the common source line has a linear shape extending in the third direction in the word line cut region, and
the common source via contact has a plug shape extending in the first direction in a local region on the upper surface of the common source line.

3. The IC device of claim 1, wherein the common source via contact protrudes outward from inside the word line cut region.

4. The IC device of claim 1, wherein a distance from the substrate to an upper surface of the common source via contact is greater than a distance from the substrate to an upper surface of the bit line contact pad.

5. The IC device of claim 1, wherein a distance from the substrate to an upper surface of the common source via contact is greater than a distance from the substrate to an upper surface of the bit line.

6. The IC device of claim 1, wherein the word line cut region buried insulating layer covers the common source line in the word line cut region in the second region, and
the common source via contact is surrounded by the word line cut region buried insulating layer in the word line cut region.

7. The IC device of claim 1, wherein the IC device further comprises an insulating spacer between the common source line and the plurality of word lines, and the word line cut region buried insulating layer covers the common source line and the insulating spacer in the word line cut region, and
a width of the word line cut region buried insulating layer in the second direction is greater than a width of the common source line in the second direction.

8. The IC device of claim 1, wherein the IC device further comprises a dummy channel region that extends in the first direction through the plurality of word lines in the second region on the substrate, and
a dummy contact pad that is on the dummy channel region and contacts an upper surface of the dummy channel region.

9. The IC device of claim 8, wherein the dummy channel region comprises a material the same as that of the channel region, and the dummy contact pad comprises a material the same as that of the bit line contact pad.

10. The IC device of claim 8, wherein the common source line extends to pass the first region and the second region, and
the common source via contact is formed only in the second region from among the first region and the second region.

11. The IC device of claim 1, wherein the height of the common source line is less than two thirds (⅔) of a total height of the word line cut region.

12. The IC device of claim 1, wherein the IC device further comprises:
at least one string select line that extends on the plurality of word lines, parallel to the plurality of word lines; and
the channel region that extends through the plurality of word lines and the at least one string select line,
wherein a level of an upper surface of the common source line is higher than a level of an upper surface of one of the at least one string select line that is farthest from the substrate.

13. The IC device of claim 1, wherein the IC device further comprises:
at least one string select line that extends on the plurality of word lines, parallel to the plurality of word lines; and
the channel region that extends through the plurality of word lines and the at least one string select line,
wherein a level of an upper surface of the common source line is lower than a level of a lower surface of one of the at least one string select line that is closest to the substrate.

14. The IC device of claim 1, wherein the IC device further comprises:
an insulating spacer between the common source line and the plurality of word lines; and
a word line cut region buried insulating layer that covers the common source line and the insulating spacer in the word line cut region,
wherein the word line cut region buried insulating layer includes a multilayer structure including at least two insulating layers of different materials.

15. The IC device of claim 1, wherein the IC device further comprises:
a first upper wiring layer on the bit line in the first region; and
a second upper wiring layer that is at a level the same as that of the first upper wiring layer in the second region and is connected to the common source via contact.

* * * * *